(12) United States Patent
Liu et al.

(10) Patent No.: US 10,303,818 B2
(45) Date of Patent: May 28, 2019

(54) ENHANCING PROCESSING SPEEDS FOR GENERATING A MODEL ON AN ELECTRONIC DEVICE

(71) Applicant: SAS Institute Inc., Cary, NC (US)

(72) Inventors: Jun Liu, Cary, NC (US); Ruiwen Zhang, Cary, NC (US); Zheng Zhao, Cupertino, CA (US)

(73) Assignee: SAS INSTITUTE INC., Cary, NC (US)

( * ) Notice: Subject to any disclaimer, the term of this patent is extended or adjusted under 35 U.S.C. 154(b) by 274 days.

(21) Appl. No.: 15/237,209

(22) Filed: Aug. 15, 2016

(65) Prior Publication Data

US 2017/0161231 A1    Jun. 8, 2017

Related U.S. Application Data

(60) Provisional application No. 62/263,806, filed on Dec. 7, 2015.

(51) Int. Cl.
| | |
|---|---|
| *G06N 20/00* | (2019.01) |
| *G06F 17/11* | (2006.01) |
| *G06F 17/50* | (2006.01) |

(52) U.S. Cl.
CPC .......... *G06F 17/5009* (2013.01); *G06F 17/11* (2013.01); *G06N 20/00* (2019.01)

(58) Field of Classification Search
CPC ........... H04L 12/26; H04L 29/08; G06N 7/00; G06N 20/00
See application file for complete search history.

(56) References Cited

U.S. PATENT DOCUMENTS

2012/0310619 A1* 12/2012 McConaghy ......... G06F 17/504
                                                          703/14
2014/0188442 A1    7/2014 Zelenka et al.
(Continued)

OTHER PUBLICATIONS

Friedman, J. et al. "Regularization paths for generalized linear models via coordinate descent." Journal of statistical software 33.1 (2010): 1.*

(Continued)

*Primary Examiner* — Eric Nilsson
(74) *Attorney, Agent, or Firm* — Kilpatrick Townsend & Stockton LLP

(57) ABSTRACT

Processing speeds for generating a model can be enhanced. For example, the model can be generated by using regression coefficient values as weights for independent variables in the model. The regression coefficient values can be determined using a coordinate descent method to find a minimum value of a least absolute shrinkage and selection operator cost function. Each iteration of the coordinate descent method can include determining a starting coordinate based on (i) a previous starting coordinate or a previous regression coefficient value from an immediately prior iteration of the coordinate descent method; (ii) a current regression coefficient value associated with a current iteration of the coordinate descent method; and (iii) a refinement factor configured to minimize a result of a univariate algorithm. Each iteration can also include performing a coordinate descent using the starting coordinate to determine a next regression coefficient value for a next iteration of the coordinate descent method.

27 Claims, 18 Drawing Sheets

(56) References Cited

U.S. PATENT DOCUMENTS

2014/0207714 A1  7/2014  He et al.
2015/0324324 A1  11/2015  Liu et al.

OTHER PUBLICATIONS

Friedman, J., et al. "Pathwise coordinate optimization." The Annals of Applied Statistics 1.2 (2007): 302-332.*
Sulis, A. "GRID computing approach for multireservoir operating rules with uncertainty." Environmental Modelling & Software 24.7 (2009): 859-864.*
Wu, T., et al. "Coordinate descent algorithms for lasso penalized regression." The Annals of Applied Statistics (2008): 224-244.*
J. H. Friedman, T. Hastie, and R. Tibshirani. "Regularization paths for generalized linear models via coordinate descent." Journal of Statistical Software, 33(1):1-22, 2010.
"Lasso (statistics)" retrieved from https://en.wikipedia.org/wiki/Lasso_(statistics) Sep. 14, 2016, 10 pages.
"Coordinate descent" retrieved from https://en.wikipedia.org/wiki/Coordinate_descent Sep. 14, 2016, 5 pages.

* cited by examiner

| k | $\beta_1^k$ | $\beta_2^k$ | $\beta_3^k$ | $\beta_4^k$ | $\beta_5^k$ | $f(\beta^k)$ |
|---|---|---|---|---|---|---|
| 1 | 0.048912 | 0.034041 | 0.407980 | 0.056587 | 0.164413 | 0.052449 |
| 2 | 0.057182 | -0.033692 | 0.465234 | 0.027810 | 0.171740 | 0.017591 |
| 3 | 0.036909 | -0.079955 | 0.463604 | -0.000612 | 0.177708 | 0.008085 |
| 4 | 0.019080 | -0.108954 | 0.458440 | -0.017618 | 0.182115 | 0.003933 |
| 5 | 0.005418 | -0.126712 | 0.455218 | -0.026135 | 0.185698 | 0.002304 |
| 6 | -0.005122 | -0.137403 | 0.453694 | -0.029295 | 0.188740 | 0.001653 |
| 7 | -0.013567 | -0.143688 | 0.453262 | -0.029210 | 0.191398 | 0.001358 |
| 8 | -0.020585 | -0.147239 | 0.453491 | -0.027216 | 0.193771 | 0.001187 |
| 9 | -0.026604 | -0.149101 | 0.454104 | -0.024144 | 0.195923 | 0.001060 |
| 10 | -0.031899 | -0.149927 | 0.454929 | -0.020507 | 0.197895 | 0.000950 |
| ⋮ | | | | | | |
| 28 | -0.081090 | -0.142355 | 0.467964 | 0.030835 | 0.217715 | 0.000106 |
| 29 | -0.082490 | -0.142044 | 0.468368 | 0.032406 | 0.218288 | 0.000093 |
| 30 | -0.083806 | -0.141752 | 0.468749 | 0.033883 | 0.218827 | 0.000082 |
| ⋮ | | | | | | |
| 100 | -0.103999 | -0.137267 | 0.474584 | 0.056543 | 0.227099 | 1.3349e-08 |
| 101 | -0.104015 | -0.137264 | 0.474589 | 0.056561 | 0.227105 | 1.1785e-08 |
| 102 | -0.104030 | -0.137261 | 0.474593 | 0.056577 | 0.227111 | 1.0403e-08 |
| 103 | -0.104044 | -0.137258 | 0.474597 | 0.056593 | 0.227117 | 9.1839e-09 |
| 104 | -0.104057 | -0.137255 | 0.474601 | 0.056608 | 0.227122 | 8.1074e-09 |
| 105 | -0.104069 | -0.137252 | 0.474604 | 0.056621 | 0.227127 | 7.1571e-09 |

| k | $\beta_1^k$ | $\beta_2^k$ | $\beta_3^k$ | $\beta_4^k$ | $\beta_5^k$ | $f(\beta^k)$ | $\alpha^k$ |
|---|---|---|---|---|---|---|---|
| 1 | 0.049912 | 0.034041 | 0.407960 | 0.055687 | 0.164413 | 0.052449 | 1.114740 |
| 2 | 0.058130 | -0.041464 | 0.471828 | 0.024612 | 0.173040 | 0.016773 | 1.520601 |
| 3 | 0.022324 | -0.108065 | 0.450034 | -0.018702 | 0.181180 | 0.004200 | 1.610933 |
| 4 | -0.000886 | -0.137517 | 0.452455 | -0.033262 | 0.187045 | 0.001791 | 1.114831 |
| 5 | -0.010602 | -0.144776 | 0.452230 | -0.033032 | 0.190141 | 0.001452 | 1.114831 |
| 6 | -0.029913 | -0.153851 | 0.453133 | -0.026748 | 0.196740 | 0.001091 | 2.700067 |
| 7 | -0.047531 | -0.149751 | 0.458275 | -0.006750 | 0.203071 | 0.000632 | 3.936469 |
| 8 | -0.052347 | -0.148709 | 0.459668 | -0.001392 | 0.205944 | 0.000530 | 1.398237 |
| 9 | -0.058803 | -0.147299 | 0.461526 | 0.005839 | 0.208586 | 0.000407 | 2.059226 |
| 10 | -0.064683 | -0.145997 | 0.463220 | 0.012415 | 0.210994 | 0.000308 | 2.134921 |
| ... | | | | | | | |
| 13 | -0.078615 | -0.143005 | 0.467249 | 0.028058 | 0.216701 | 0.000129 | 1.100414 |
| 14 | -0.093529 | -0.139593 | 0.471552 | 0.044782 | 0.222808 | 0.000023 | 9.617055 |
| 15 | -0.094167 | -0.139451 | 0.471743 | 0.045510 | 0.223071 | 0.000020 | 0.997764 |
| 16 | -0.104249 | -0.137213 | 0.474657 | 0.056823 | 0.227201 | 3.3024e-11 | 16.530123 |
| ... | | | | | | | |
| 28 | -0.104260 | -0.137210 | 0.474660 | 0.056835 | 0.227205 | 6.3207e-15 | 1.197748 |
| 29 | -0.104260 | -0.137210 | 0.474660 | 0.056835 | 0.227205 | 5.7081e-15 | 0.890278 |
| 30 | -0.104260 | -0.137210 | 0.474660 | 0.056835 | 0.227205 | 2.0807e-15 | 6.945350 |

FIG. 16

ENHANCING PROCESSING SPEEDS FOR GENERATING A MODEL ON AN ELECTRONIC DEVICE

REFERENCE TO RELATED APPLICATION

This claims the benefit of priority under 35 U.S.C. § 119(e) to U.S. Provisional Patent Application No. 62/263,806 filed Dec. 7, 2015, the entirety of which is hereby incorporated by reference herein.

TECHNICAL FIELD

The present disclosure relates generally to modeling and simulation. More specifically, but not by way of limitation, this disclosure relates to enhancing processing speeds for generating a model on an electronic device.

BACKGROUND

Statistical models can represent complex relationships among pieces of data. These models can be generated from large data sets that have hundreds or thousands of interrelated pieces of data and can be very challenging to formulate. It can take a significant amount of time, memory, processing power, and electrical power to generate these statistical models. For example, a computing device may perform hundreds of thousands of calculations over hundreds of iterations of steps to generate these models, during which time the computing device may repeatedly access and store information in thousands of memory locations. This level of processing can take hours, or days, to perform; can require a significant amount of electrical power; can reduce the available resources (e.g., processing power and memory) on the computing device for performing other tasks; can slow down other processes executing on the computing device; and can require complicated and expensive hardware.

SUMMARY

In one example, a non-transitory computer readable medium comprising program code that is executable by a processor is provided. The program code can cause the processor to determine a plurality of regression coefficient values associated with a regression analysis of data using a coordinate descent method for finding a minimum value of a least absolute shrinkage and selection operator (LASSO) cost function. Each iteration of the coordinate descent method can include determining a starting coordinate based on (i) a previous starting coordinate or a previous regression coefficient value from an immediately prior iteration of the coordinate descent method; (ii) a current regression coefficient value associated with a current iteration of the coordinate descent method; and (iii) a refinement factor configured to minimize a result of a univariate algorithm. Each iteration of the coordinate descent method can also include starting at the starting coordinate and performing a coordinate descent to determine a next regression coefficient value for a next iteration of the coordinate descent method. The program code can cause the processor to generate a model that represents a relationship between a plurality of independent variables and the data by assigning a respective weight to each respective independent variable of the plurality of independent variables. Each respective weight can be a particular regression coefficient value of the plurality of regression coefficient values that corresponds to the respective independent variable. The program code can cause the processor to receive additional data and determine a characteristic associated with additional data using the model.

In another example, a system is provided that can include a processing device and a memory device. The memory device can include instructions executable by the processing device for causing the processing device to determine a plurality of regression coefficient values associated with a regression analysis of data using a coordinate descent method for finding a minimum value of a least absolute shrinkage and selection operator (LASSO) cost function. Each iteration of the coordinate descent method can include determining a starting coordinate based on (i) a previous starting coordinate or a previous regression coefficient value from an immediately prior iteration of the coordinate descent method; (ii) a current regression coefficient value associated with a current iteration of the coordinate descent method; and (iii) a refinement factor configured to minimize a result of a univariate algorithm. Each iteration of the coordinate descent method can also include starting at the starting coordinate and performing a coordinate descent to determine a next regression coefficient value for a next iteration of the coordinate descent method. The instructions can cause the processing device to generate a model that represents a relationship between a plurality of independent variables and the data by assigning a respective weight to each respective independent variable of the plurality of independent variables. Each respective weight can be a particular regression coefficient value of the plurality of regression coefficient values that corresponds to the respective independent variable. The instructions can cause the processing device to receive additional data and determine a characteristic associated with additional data using the model.

In another example, a method is provided that can include determining a plurality of regression coefficient values associated with a regression analysis of data by using a coordinate descent method for finding a minimum value of a least absolute shrinkage and selection operator (LASSO) cost function. Each iteration of the coordinate descent method can include determining a starting coordinate based on (i) a previous starting coordinate or a previous regression coefficient value from an immediately prior iteration of the coordinate descent method; (ii) a current regression coefficient value associated with a current iteration of the coordinate descent method; and (iii) a refinement factor configured to minimize a result of a univariate algorithm. Each iteration of the coordinate descent method can also include starting at the starting coordinate and performing a coordinate descent to determine a next regression coefficient value for a next iteration of the coordinate descent method. The method can include generating a model that represents a relationship between a plurality of independent variables and the data by assigning a respective weight to each respective independent variable of the plurality of independent variables. Each respective weight can be a particular regression coefficient value of the plurality of regression coefficient values that corresponds to the respective independent variable. The method can include receiving additional data and determining a characteristic associated with additional data using the model.

This summary is not intended to identify key or essential features of the claimed subject matter, nor is it intended to be used in isolation to determine the scope of the claimed subject matter. The subject matter should be understood by reference to appropriate portions of the entire specification, any or all drawings, and each claim.

The foregoing, together with other features and examples, will become more apparent upon referring to the following specification, claims, and accompanying drawings.

BRIEF DESCRIPTION OF THE DRAWINGS

The present disclosure is described in conjunction with the appended figures:

FIG. 12 is a table of an example of regression coefficient values obtained using a traditional coordinate descent method when $\lambda = 0$ according to some aspects.

FIG. 16 is a table of an example of regression coefficient values obtained using the SRRC technique shown in FIG. 15 according to some aspects.

Figure 1:
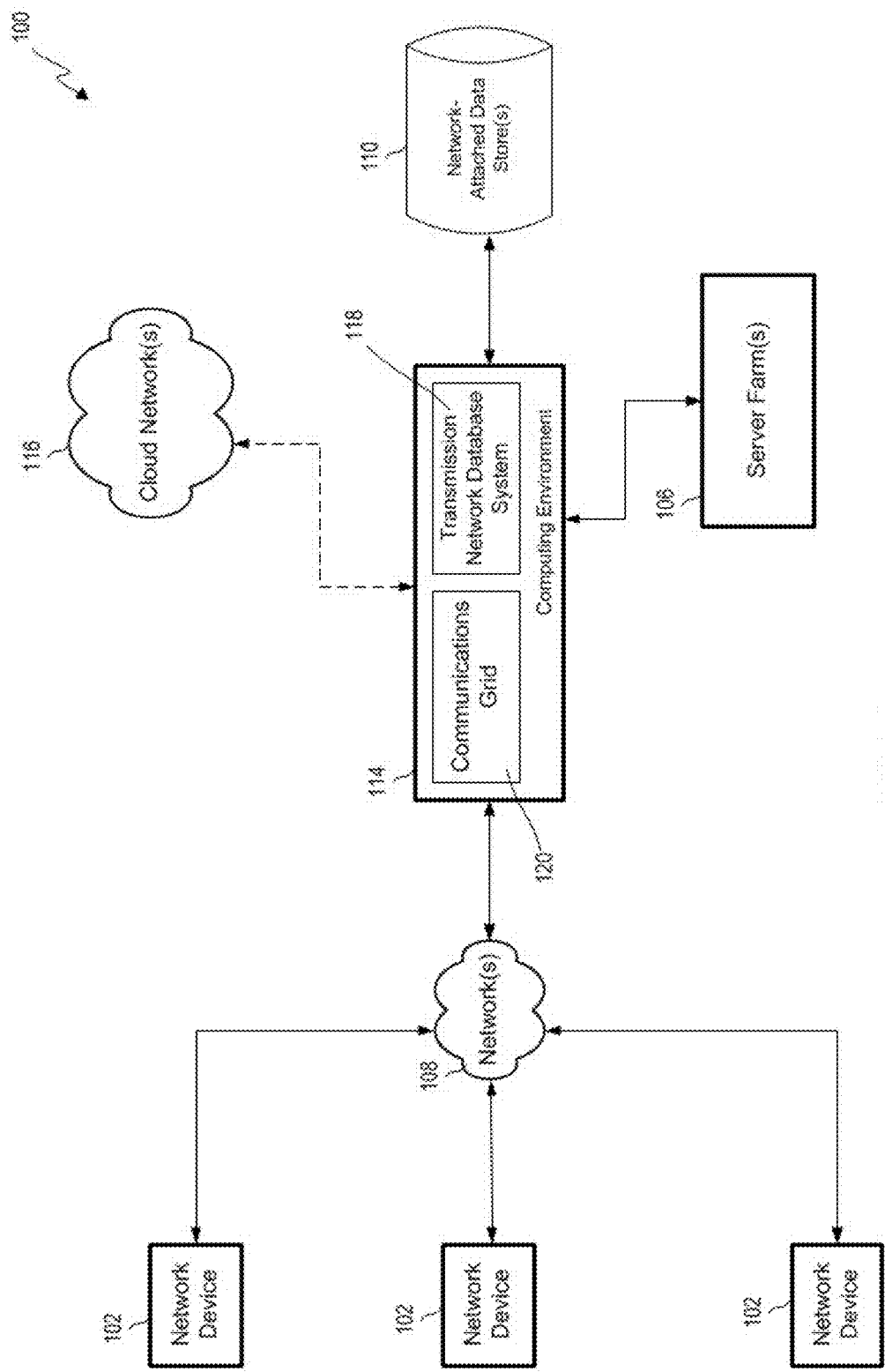
FIG. 1 is a block diagram of an example of the hardware components of a computing system according to some aspects.

In the appended figures, similar components or features can have the same reference label. Further, various components of the same type can be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of examples of the technology. But various examples can be practiced without these specific details. The figures and description are not intended to be restrictive.

The ensuing description provides examples only, and is not intended to limit the scope, applicability, or configuration of the disclosure. Rather, the ensuing description of the examples provides those skilled in the art with an enabling description for implementing an example. Various changes may be made in the function and arrangement of elements without departing from the spirit and scope of the technology as set forth in the appended claims.

Specific details are given in the following description to provide a thorough understanding of the examples. But the examples may be practiced without these specific details. For example, circuits, systems, networks, processes, and other components can be shown as components in block diagram form to prevent obscuring the examples in unnecessary detail. In other examples, well-known circuits, processes, algorithms, structures, and techniques may be shown without unnecessary detail in order to avoid obscuring the examples.

Also, individual examples can be described as a process that is depicted as a flowchart, a flow diagram, a data flow diagram, a structure diagram, or a block diagram. Although a flowchart can describe the operations as a sequential process, many of the operations can be performed in parallel or concurrently. In addition, the order of the operations can be re-arranged. A process is terminated when its operations are completed, but can have additional operations not included in a figure. A process can correspond to a method, a function, a procedure, a subroutine, a subprogram, etc. When a process corresponds to a function, its termination can correspond to a return of the function to the calling function or the main function.

Systems depicted in some of the figures can be provided in various configurations. In some examples, the systems can be configured as a distributed system where one or more components of the system are distributed across one or more networks in a cloud computing system.

Certain aspects and features of the present disclosure relate to improving processing speeds and reducing an amount of memory used by an electronic device to generate a model from a data set by reducing a number of processing iterations and memory accesses required to generate the model. For example, as discussed in greater detail below, the electronic device can use a modified coordinate descent method that requires fewer processing iterations and fewer memory accesses to generate the model. This can result in less processing power, memory, and electrical power being consumed by an electronic device to generate the model.

A model can represent relationships between various pieces of data from the data set and stored in memory. For example, some data stored in memory, which can be referred to as dependent variables, can dependent on other pieces of data stored in memory, which can be referred to as independent variables. The model can represent relationships among the independent variables and the dependent variables. For example, the model can include weights assigned to each independent variable representing the influence the independent variable has on a dependent variable.

To determine a weight for each independent variable, the electronic device can perform a series of processing iterations on the data set. The processing iterations can take the form of a regression analysis, which is a statistical process for estimating relationships among variables (e.g., independent and dependent variables). In one example, the processor can use a least squares technique, which is a type of regression analysis, to determine the weights to assign to each independent variable. Because the weights can be determined using regression analysis and can act as coefficients in the model, the weights can be referred to as regression coefficients.

The number of processing iterations and amount of memory required to perform a regression analysis can increase dramatically when the data set includes multiple independent variables, multiple dependent variables, or both of these. Such data sets can be referred to as high-dimensional data sets. An example of high-dimensional data set can include various characteristics about athletes correlated to each athlete's success. Examples of the characteristics can include age, gender, team on which the athlete is a member, height, weight, sport in which the athlete primarily competes, position the athlete plays, etc. The various characteristics can be the independent variables and a numerical value that is indicative of the athlete's success can be the dependent variable. The processor can use regression analysis to generate a model from the data set that represents the influence that each characteristic has on an athlete's success. But it can take thousands, if not hundreds of thousands, of processing iterations and computations to generate the model using traditional approaches for analyzing high-dimensional data sets.

Some examples can overcome the above and other issues by using a least absolute shrinkage and selection operator (LASSO) method in conjunction with a modified coordinate descent method. LASSO can involve using only a subset of the independent variables to generate the model, rather than using all of the independent variables to generate the model. For example, LASSO can force a sum of an absolute value of the regression coefficients to be less than a fixed value, which in turn can result in some of the regression coefficients being set to zero. The model can then be generated from the independent variables that have corresponding regression coefficients that are nonzero. This can result in a simpler model that relies on fewer independent variables. Such a model may be more accurate than a model that includes all of the independent variables.

More specifically, with LASSO, regression coefficients ($\beta$) are determined that solve the following equation:

$$\min_\beta f(\beta) = \tfrac{1}{2}\|X\beta - y\|_2^2 + \lambda\|\beta\|_1 \quad \text{(Equation 1)}$$

where $\beta$ includes regression coefficients; X includes an input matrix that is equal to $[x_1, x_2, \ldots, x_p] \in R^{n \times p}$, where n includes a number of data samples and p includes a number of independent variables; $y \in R^{n \times 1}$ can be an output vector (e.g., indicating a response to the input matrix X); and $\lambda$ can be a regularization parameter that is non-negative. Typically, a larger $\lambda$ value results in a sparser solution, meaning that many components of $\beta$ are zero. The nonzero components of $\beta$ can be used as the regression coefficients for the model.

One approach to determining regression coefficients that solve Equation 1 is to use a method referred to as coordinate descent. Coordinate descent is based on the concept that a complex, multivariable function (e.g., $f(\beta)$) can be more easily minimized by solving a series of minimization subproblems, rather than trying to minimize the multivariable function all at once. Coordinate descent involves breaking down a complex minimization problem into a series of simpler minimization problems that are more easily solved.

Traditional coordinate descent can include determining a starting coordinate (e.g., having an X value determined from the input matrix and a Y value determined from the output matrix) at which to start the coordinate descent process. For example, the starting coordinate can be $(x_1, y_1)$. Thereafter, the value for one direction (e.g., $x_1$ in the X direction) can be adjusted to minimize the multivariable function. Then, the value for another direction (e.g., $y_1$ in the Y direction) can be adjusted to minimize the multivariable function. This process can repeated for all directions and coordinates to determine values that minimize the overall multivariable function, $f(\beta)$.

But, with traditional coordinate descent, the computational cost to determine the regression coefficients using Equation 1 can increase as the value for $\lambda$ (in Equation 1) decreases. Thus, it can take more iterations, time, processing power, memory, and electrical power to perform the coordinate descent method if the value for $\lambda$ is small. For example, it can take 10 or more iterations for the value for $f(\beta^k)$ to converge to a suitably low value of less than $10^{-3}$ (e.g., 0.000950). It may therefore be desirable to use alternative approaches to solving Equation 1, particularly when the value of $\lambda$ is small.

Some examples can reduce the total number of processing iterations, time, memory, and electrical power used to solve Equation 1 by implementing a modified version of the coordinate descent method. The modified version can be based on the concept that, for a given coordinate during an iteration of the coordinate descent, a regression coefficient value for the next iteration ($\beta^{k+1}$) can lie on a ray (e.g., a line) that starts at the regression coefficient value from the previous iteration ($\beta^{k-1}$) and passes through the regression coefficient value for the current iteration ($\beta^k$). This can be referred to a ray-continuation property, which will be described in greater detail below. The modified version can be faster and computationally less expensive than traditional coordinate descent, resulting in less time, memory, processing power, and electrical power being needed to generate the model. The electronic device can use the combination of LASSO and the modified version of the coordinate descent method to analyze high-dimensional data sets at faster speeds and using less memory than alternative approaches.

FIGS. 1-10 depict examples of systems and methods usable for enhancing modeling speeds in an electronic device. For example, FIG. 1 is a block diagram of an example of the hardware components of a computing system according to some aspects. Data transmission network 100 is a specialized computer system that may be used for processing large amounts of data where a large number of computer processing cycles are required.

Data transmission network 100 may also include computing environment 114. Computing environment 114 may be a specialized computer or other machine that processes the data received within the data transmission network 100. The computing environment 114 may include one or more other systems. For example, computing environment 114 may include a database system 118 or a communications grid 120.

Data transmission network 100 also includes one or more network devices 102. Network devices 102 may include client devices that can communicate with computing environment 114. For example, network devices 102 may send data to the computing environment 114 to be processed, may send communications to the computing environment 114 to control different aspects of the computing environment or the data it is processing, among other reasons. Network devices 102 may interact with the computing environment 114 through a number of ways, such as, for example, over one or more networks 108.

In some examples, network devices 102 may provide a large amount of data, either all at once or streaming over a period of time (e.g., using event stream processing (ESP)), to the computing environment 114 via networks 108. For example, the network devices 102 can transmit electronic messages for use in enhancing modeling speeds in an electronic device, all at once or streaming over a period of time, to the computing environment 114 via networks 108.

The network devices 102 may include network computers, sensors, databases, or other devices that may transmit or otherwise provide data to computing environment 114. For example, network devices 102 may include local area network devices, such as routers, hubs, switches, or other computer networking devices. These devices may provide a variety of stored or generated data, such as network data or data specific to the network devices 102 themselves. Network devices 102 may also include sensors that monitor their environment or other devices to collect data regarding that environment or those devices, and such network devices 102 may provide data they collect over time. Network devices 102 may also include devices within the internet of things, such as devices within a home automation network. Some of these devices may be referred to as edge devices, and may involve edge-computing circuitry. Data may be transmitted by network devices 102 directly to computing environment 114 or to network-attached data stores, such as network-attached data stores 110 for storage so that the data may be retrieved later by the computing environment 114 or other portions of data transmission network 100. For example, the network devices 102 can transmit data usable for generating a model to a network-attached data store 110 for storage. The computing environment 114 may later retrieve the data from the network-attached data store 110 and use the data to construct the model.

Network-attached data stores 110 can store data to be processed by the computing environment 114 as well as any intermediate or final data generated by the computing system in non-volatile memory. But in certain examples, the configuration of the computing environment 114 allows its operations to be performed such that intermediate and final data results can be stored solely in volatile memory (e.g., RAM), without a requirement that intermediate or final data results be stored to non-volatile types of memory (e.g., disk). This can be useful in certain situations, such as when the computing environment 114 receives ad hoc queries from a user and when responses, which are generated by processing large amounts of data, need to be generated dynamically (e.g., on the fly). In this situation, the computing environment 114 may be configured to retain the processed information within memory so that responses can be generated for the user at different levels of detail as well as allow a user to interactively query against this information.

Network-attached data stores 110 may store a variety of different types of data organized in a variety of different ways and from a variety of different sources. For example, network-attached data stores may include storage other than primary storage located within computing environment 114 that is directly accessible by processors located therein. Network-attached data stores may include secondary, tertiary or auxiliary storage, such as large hard drives, servers, virtual memory, among other types. Storage devices may include portable or non-portable storage devices, optical storage devices, and various other mediums capable of storing, containing data. A machine-readable storage medium or computer-readable storage medium may include a non-transitory medium in which data can be stored and that does not include carrier waves or transitory electronic communications. Examples of a non-transitory medium may include, for example, a magnetic disk or tape, optical storage media such as compact disk or digital versatile disk, flash memory, memory or memory devices. A computer-program product may include code or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing or receiving information, data, arguments, parameters, or memory contents. Information, arguments, parameters, data, etc. may be passed, forwarded, or transmitted via any suitable means including memory sharing, message passing, token passing, network transmission, among others. Furthermore, the data stores may hold a variety of different types of data. For example, network-attached data stores 110 may hold unstructured (e.g., raw) data, such as regression coefficients or other data associated with a model.

The unstructured data may be presented to the computing environment 114 in different forms such as a flat file or a conglomerate of data records, and may have data values and accompanying time stamps. The computing environment 114 may be used to analyze the unstructured data in a variety of ways to determine the best way to structure (e.g., hierarchically) that data, such that the structured data is tailored to a type of further analysis that a user wishes to perform on the data. For example, after being processed, the unstructured time-stamped data may be aggregated by time (e.g., into daily time period units) to generate time series data or structured hierarchically according to one or more dimensions (e.g., parameters, attributes, or variables). For example, data may be stored in a hierarchical data structure, such as a relational online analytical processing (ROLAP) or multidimensional online analytical processing (MOLAP) database, or may be stored in another tabular form, such as in a flat-hierarchy form.

Data transmission network 100 may also include one or more server farms 106. Computing environment 114 may route select communications or data to the sever farms 106 or one or more servers within the server farms 106. Server farms 106 can be configured to provide information in a predetermined manner. For example, server farms 106 may access data to transmit in response to a communication. Server farms 106 may be separately housed from each other device within data transmission network 100, such as computing environment 114, or may be part of a device or system.

Server farms 106 may host a variety of different types of data processing as part of data transmission network 100. Server farms 106 may receive a variety of different data from network devices, from computing environment 114, from cloud network 116, or from other sources. The data may have been obtained or collected from one or more websites, sensors, as inputs from a control database, or may have been received as inputs from an external system or device. Server farms 106 may assist in processing the data by turning raw data into processed data based on one or more rules implemented by the server farms. For example, sensor data may be analyzed to determine changes in an environment over time or in real-time. As another example, website data or other data may be analyzed to generate a model.

Data transmission network 100 may also include one or more cloud networks 116. Cloud network 116 may include a cloud infrastructure system that provides cloud services. In certain examples, services provided by the cloud network 116 may include a host of services that are made available to users of the cloud infrastructure system on demand. Cloud network 116 is shown in FIG. 1 as being connected to computing environment 114 (and therefore having computing environment 114 as its client or user), but cloud network 116 may be connected to or utilized by any of the devices in FIG. 1. Services provided by the cloud network 116 can dynamically scale to meet the needs of its users. The cloud network 116 may include one or more computers, servers, or systems. In some examples, the computers, servers, or systems that make up the cloud network 116 are different from the user's own on-premises computers, servers, or systems. For example, the cloud network 116 may host an application, and a user may, via a communication network such as the Internet, order and use the application on demand. In some examples, the cloud network 116 may host an application for performing data analytics or generating a model While each device, server, and system in FIG. 1 is shown as a single device, multiple devices may instead be used. For example, a set of network devices can be used to transmit various communications from a single user, or remote server 140 may include a server stack. As another example, data may be processed as part of computing environment 114.

Each communication within data transmission network 100 (e.g., between client devices, between a device and connection management system 150, between server farms 106 and computing environment 114, or between a server and a device) may occur over one or more networks 108. Networks 108 may include one or more of a variety of different types of networks, including a wireless network, a wired network, or a combination of a wired and wireless network. Examples of suitable networks include the Internet, a personal area network, a local area network (LAN), a wide area network (WAN), or a wireless local area network (WLAN). A wireless network may include a wireless interface or combination of wireless interfaces. As an example, a network in the one or more networks 108 may include a short-range communication channel, such as a Bluetooth or a Bluetooth Low Energy channel. A wired network may include a wired interface. The wired or wireless networks may be implemented using routers, access points, bridges, gateways, or the like, to connect devices in the network 108. The networks 108 can be incorporated entirely within or can include an intranet, an extranet, or a combination thereof. In one example, communications between two or more systems or devices can be achieved by a secure communications protocol, such as secure sockets layer (SSL) or transport layer security (TLS). In addition, data or transactional details may be encrypted.

Some aspects may utilize the Internet of Things (IoT), where things (e.g., machines, devices, phones, sensors) can be connected to networks and the data from these things can be collected and processed within the things or external to the things. For example, the IoT can include sensors in many different devices, and high value analytics can be applied to identify hidden relationships and drive increased efficiencies. This can apply to both big data analytics and real-time (e.g., ESP) analytics.

As noted, computing environment 114 may include a communications grid 120 and a transmission network database system 118. Communications grid 120 may be a grid-based computing system for processing large amounts of data. The transmission network database system 118 may be for managing, storing, and retrieving large amounts of data that are distributed to and stored in the one or more network-attached data stores 110 or other data stores that reside at different locations within the transmission network database system 118. The computing nodes in the communications grid 120 and the transmission network database system 118 may share the same processor hardware, such as processors that are located within computing environment 114.

In some examples, the computing environment 114, a network device 102, or both can implement one or more processes for enhancing modeling speeds in an electronic device. For example, the computing environment 114, a network device 102, or both can implement one or more versions of the processes discussed with respect to FIGS. 11-12.

Figure 2:
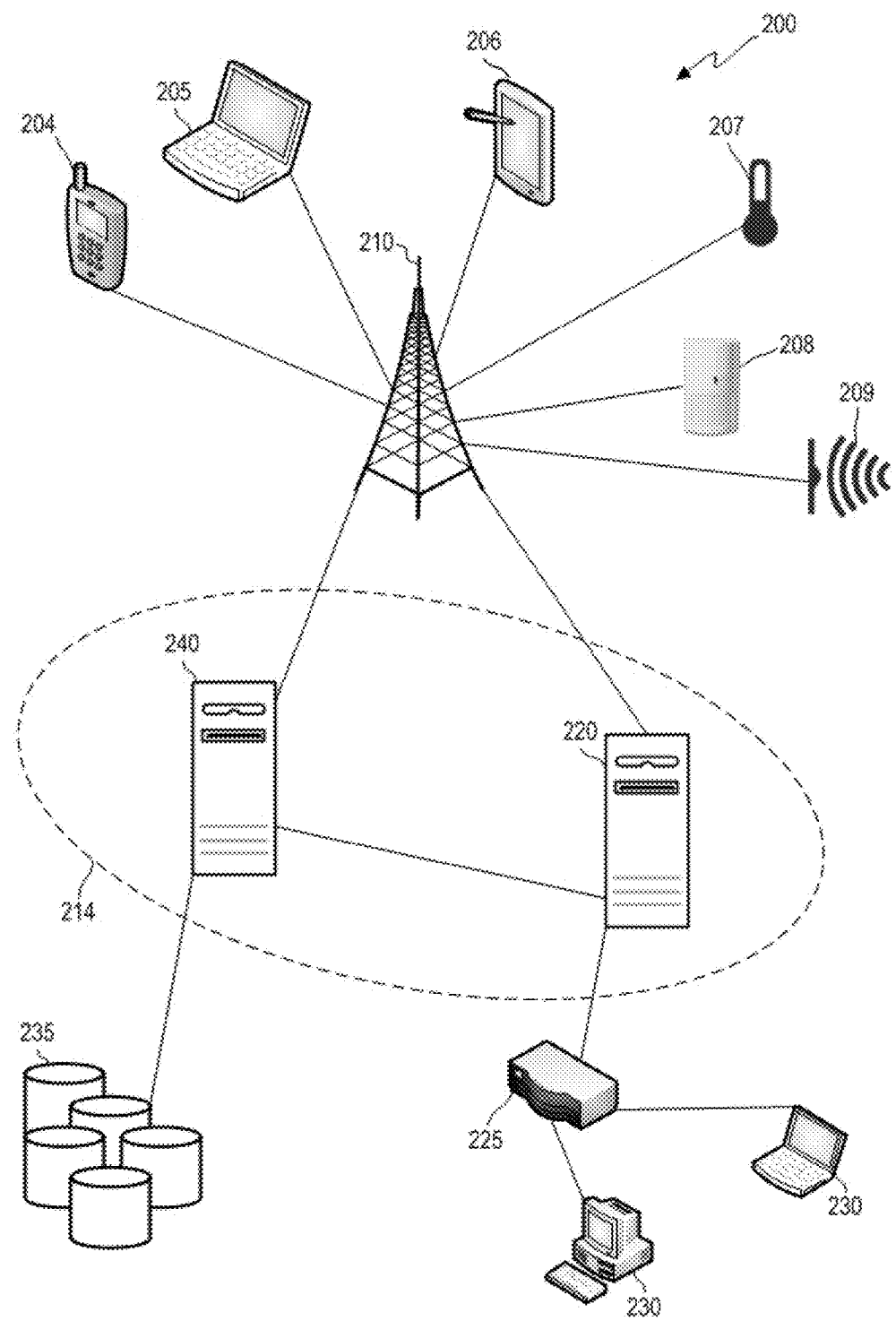
FIG. 2 is an example of devices that can communicate with each other over an exchange system and via a network according to some aspects.

FIG. 2 is an example of devices that can communicate with each other over an exchange system and via a network according to some aspects. As noted, each communication within data transmission network 100 may occur over one or more networks. System 200 includes a network device 204 configured to communicate with a variety of types of client devices, for example client devices 230, over a variety of types of communication channels.

As shown in FIG. 2, network device 204 can transmit a communication over a network (e.g., a cellular network via a base station 210). In some examples, the communication can include data associated with one or more models. The communication can be routed to another network device, such as network devices 205-209, via base station 210. The communication can also be routed to computing environment 214 via base station 210. In some examples, the network device 204 may collect data either from its surrounding environment or from other network devices (such as network devices 205-209) and transmit that data to computing environment 214.

Although network devices 204-209 are shown in FIG. 2 as a mobile phone, laptop computer, tablet computer, temperature sensor, motion sensor, and audio sensor respectively, the network devices may be or include sensors that are sensitive to detecting aspects of their environment. For example, the network devices may include sensors such as water sensors, power sensors, electrical current sensors, chemical sensors, optical sensors, pressure sensors, geographic or position sensors (e.g., GPS), velocity sensors, acceleration sensors, flow rate sensors, among others. Examples of characteristics that may be sensed include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, and electrical current, among others. The sensors may be mounted to various components used as part of a variety of different types of systems. The network devices may detect and record data related to the environment that it monitors, and transmit that data to computing environment 214.

The network devices 204-209 may also perform processing on data it collects before transmitting the data to the computing environment 214, or before deciding whether to transmit data to the computing environment 214. For example, network devices 204-209 may determine whether data collected meets certain rules, for example by comparing data or values calculated from the data and comparing that data to one or more thresholds. The network devices 204-209 may use this data or comparisons to determine if the data is to be transmitted to the computing environment 214 for further use or processing. In some examples, the network devices 204-209 can pre-process the data prior to transmitting the data to the computing environment 214. For example, the network devices 204-209 can reformat the data before transmitting the data to the computing environment 214 for further processing (e.g., which can include generating a model from the data).

Computing environment 214 may include machines 220, 240. Although computing environment 214 is shown in FIG. 2 as having two machines 220, 240, computing environment 214 may have only one machine or may have more than two machines. The machines 220, 240 that make up computing environment 214 may include specialized computers, servers, or other machines that are configured to individually or collectively process large amounts of data. The computing environment 214 may also include storage devices that include one or more databases of structured data, such as data organized in one or more hierarchies, or unstructured data. The databases may communicate with the processing devices within computing environment 214 to distribute data to them. Since network devices may transmit data to computing environment 214, that data may be received by the computing environment 214 and subsequently stored within those storage devices. Data used by computing environment 214 may also be stored in data stores 235, which may also be a part of or connected to computing environment 214.

Computing environment 214 can communicate with various devices via one or more routers 225 or other inter-network or intra-network connection components. For example, computing environment 214 may communicate with client devices 230 via one or more routers 225. Computing environment 214 may collect, analyze or store data from or pertaining to communications, client device operations, client rules, or user-associated actions stored at one or more data stores 235. Such data may influence communication routing to the devices within computing environment 214, how data is stored or processed within computing environment 214, among other actions.

Notably, various other devices can further be used to influence communication routing or processing between devices within computing environment 214 and with devices outside of computing environment 214. For example, as shown in FIG. 2, computing environment 214 may include a machine 240 that is a web server. Computing environment 214 can retrieve data of interest, such as client information (e.g., product information, client rules, etc.), technical product details, news, blog posts, e-mails, forum posts, electronic documents, social media posts (e.g., Twitter™ posts or Facebook™ posts), and so on.

In addition to computing environment 214 collecting data (e.g., as received from network devices, such as sensors, and client devices or other sources) to be processed as part of a big data analytics project, it may also receive data in real time as part of a streaming analytics environment. As noted, data may be collected using a variety of sources as communicated via different kinds of networks or locally. Such data may be received on a real-time streaming basis. For example, network devices 204-209 may receive data periodically and in real time from a web server or other source. Devices within computing environment 214 may also perform pre-analysis on data it receives to determine if the data received should be processed as part of an ongoing project. For example, as part of a project in which a model is generated from data, the computing environment 214 can perform a pre-analysis of the data. The pre-analysis can include determining whether the data is in a correct format for generating the model and, if not, reformatting the data into the correct format.

Figure 3:
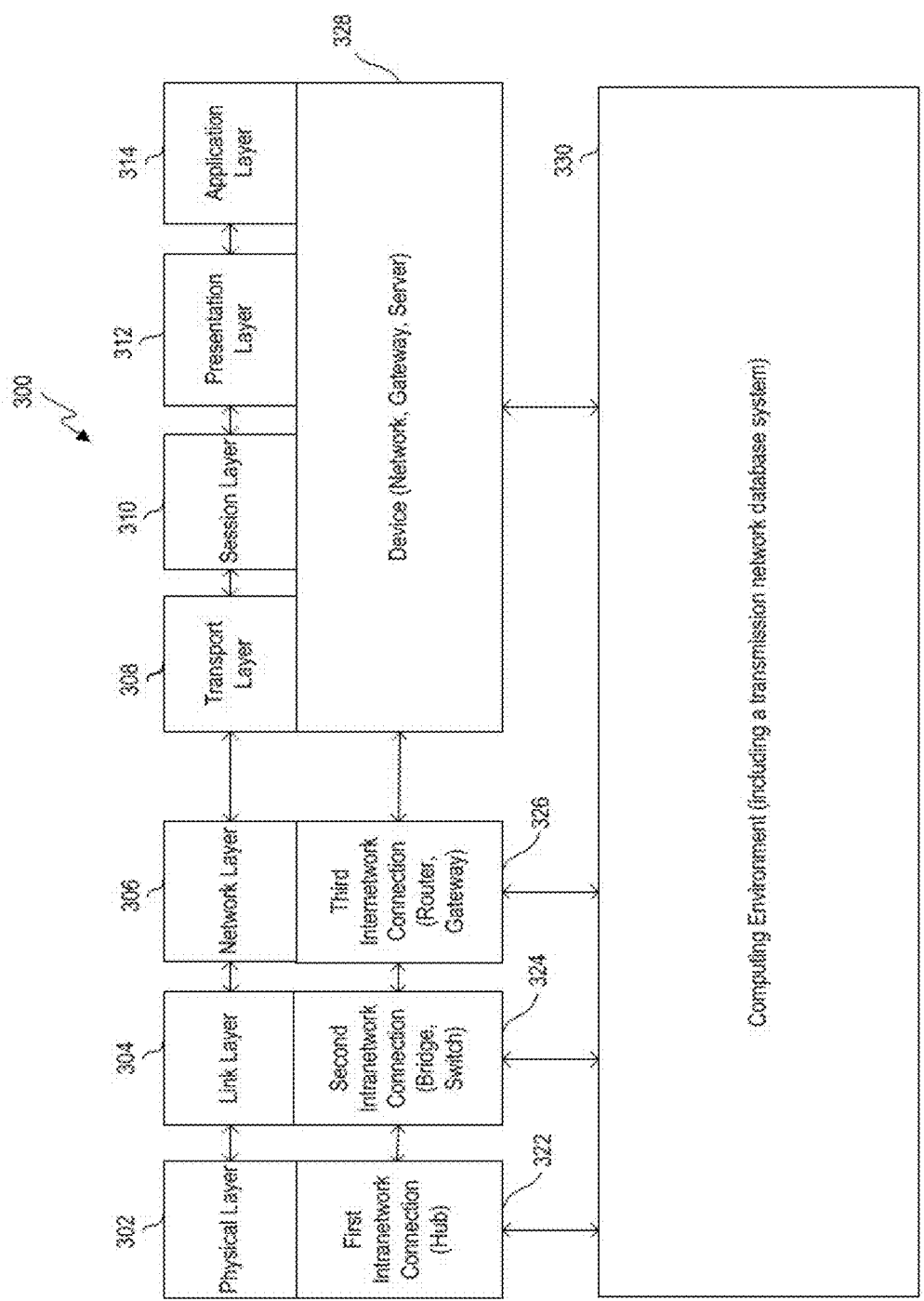
FIG. 3 is a block diagram of a model of an example of a communications protocol system according to some aspects.

FIG. 3 is a block diagram of a model of an example of a communications protocol system according to some aspects. More specifically, FIG. 3 identifies operation of a computing environment in an Open Systems Interaction model that corresponds to various connection components. The model 300 shows, for example, how a computing environment, such as computing environment (or computing environment 214 in FIG. 2) may communicate with other devices in its network, and control how communications between the computing environment and other devices are executed and under what conditions.

The model 300 can include layers 302-314. The layers 302-314 are arranged in a stack. Each layer in the stack serves the layer one level higher than it (except for the application layer, which is the highest layer), and is served by the layer one level below it (except for the physical layer 302, which is the lowest layer). The physical layer 302 is the lowest layer because it receives and transmits raw bites of data, and is the farthest layer from the user in a communications system. On the other hand, the application layer is the highest layer because it interacts directly with a software application.

As noted, the model 300 includes a physical layer 302. Physical layer 302 represents physical communication, and can define parameters of that physical communication. For example, such physical communication may come in the form of electrical, optical, or electromagnetic communications. Physical layer 302 also defines protocols that may control communications within a data transmission network.

Link layer 304 defines links and mechanisms used to transmit (e.g., move) data across a network. The link layer manages node-to-node communications, such as within a grid-computing environment. Link layer 304 can detect and correct errors (e.g., transmission errors in the physical layer 302). Link layer 304 can also include a media access control (MAC) layer and logical link control (LLC) layer.

Network layer 306 can define the protocol for routing within a network. In other words, the network layer coordinates transferring data across nodes in a same network (e.g., such as a grid-computing environment). Network layer 306 can also define the processes used to structure local addressing within the network.

Transport layer 308 can manage the transmission of data and the quality of the transmission or receipt of that data. Transport layer 308 can provide a protocol for transferring data, such as, for example, a Transmission Control Protocol (TCP). Transport layer 308 can assemble and disassemble data frames for transmission. The transport layer can also detect transmission errors occurring in the layers below it.

Session layer 310 can establish, maintain, and manage communication connections between devices on a network. In other words, the session layer controls the dialogues or nature of communications between network devices on the network. The session layer may also establish checkpointing, adjournment, termination, and restart procedures.

Presentation layer 312 can provide translation for communications between the application and network layers. In other words, this layer may encrypt, decrypt or format data based on data types known to be accepted by an application or network layer.

Application layer 314 interacts directly with software applications and end users, and manages communications between them. Application layer 314 can identify destinations, local resource states or availability or communication content or formatting using the applications.

For example, a communication link can be established between two devices on a network. One device can transmit an analog or digital representation of an electronic message that includes a data set to the other device. The other device can receive the analog or digital representation at the physical layer 302. The other device can transmit the data associated with the electronic message through the remaining layers 304-314. The application layer 314 can receive data associated with the electronic message. The application layer 314 can identify one or more applications, such as a modeling application, to which to transmit data associated with the electronic message. The application layer 314 can transmit the data to the identified application.

Intra-network connection components 322, 324 can operate in lower levels, such as physical layer 302 and link layer 304, respectively. For example, a hub can operate in the physical layer, a switch can operate in the physical layer, and a router can operate in the network layer. Inter-network connection components 326, 328 are shown to operate on higher levels, such as layers 306-314. For example, routers can operate in the network layer and network devices can operate in the transport, session, presentation, and application layers.

A computing environment 330 can interact with or operate on, in various examples, one, more, all or any of the various layers. For example, computing environment 330 can interact with a hub (e.g., via the link layer) to adjust which devices the hub communicates with. The physical layer 302 may be served by the link layer 304, so it may implement such data from the link layer 304. For example, the computing environment 330 may control which devices from which it can receive data. For example, if the computing environment 330 knows that a certain network device has turned off, broken, or otherwise become unavailable or unreliable, the computing environment 330 may instruct the hub to prevent any data from being transmitted to the computing environment 330 from that network device. Such a process may be beneficial to avoid receiving data that is inaccurate or that has been influenced by an uncontrolled environment. As another example, computing environment 330 can communicate with a bridge, switch, router or gateway and influence which device within the system (e.g., system 200) the component selects as a destination. In some examples, computing environment 330 can interact with various layers by exchanging communications with equipment operating on a particular layer by routing or modifying existing communications. In another example, such as in a grid-computing environment, a node may determine how data within the environment should be routed (e.g., which node should receive certain data) based on certain parameters or information provided by other layers within the model.

The computing environment 330 may be a part of a communications grid environment, the communications of which may be implemented as shown in the protocol of FIG. 3. For example, referring back to FIG. 2, one or more machines 220 and 240 may be part of a communications grid-computing environment. A gridded computing environment may be employed in a distributed system with non-interactive workloads where data resides in memory on the machines, or compute nodes. In such an environment, analytic code, instead of a database management system, can control the processing performed by the nodes. Data is co-located by pre-distributing it to the grid nodes, and the analytic code on each node loads the local data into memory. Each node may be assigned a particular task, such as a portion of a processing project, or to organize or control other nodes within the grid. For example, each node may be assigned a portion of a processing task for generating a model or using a model.

Figure 4:
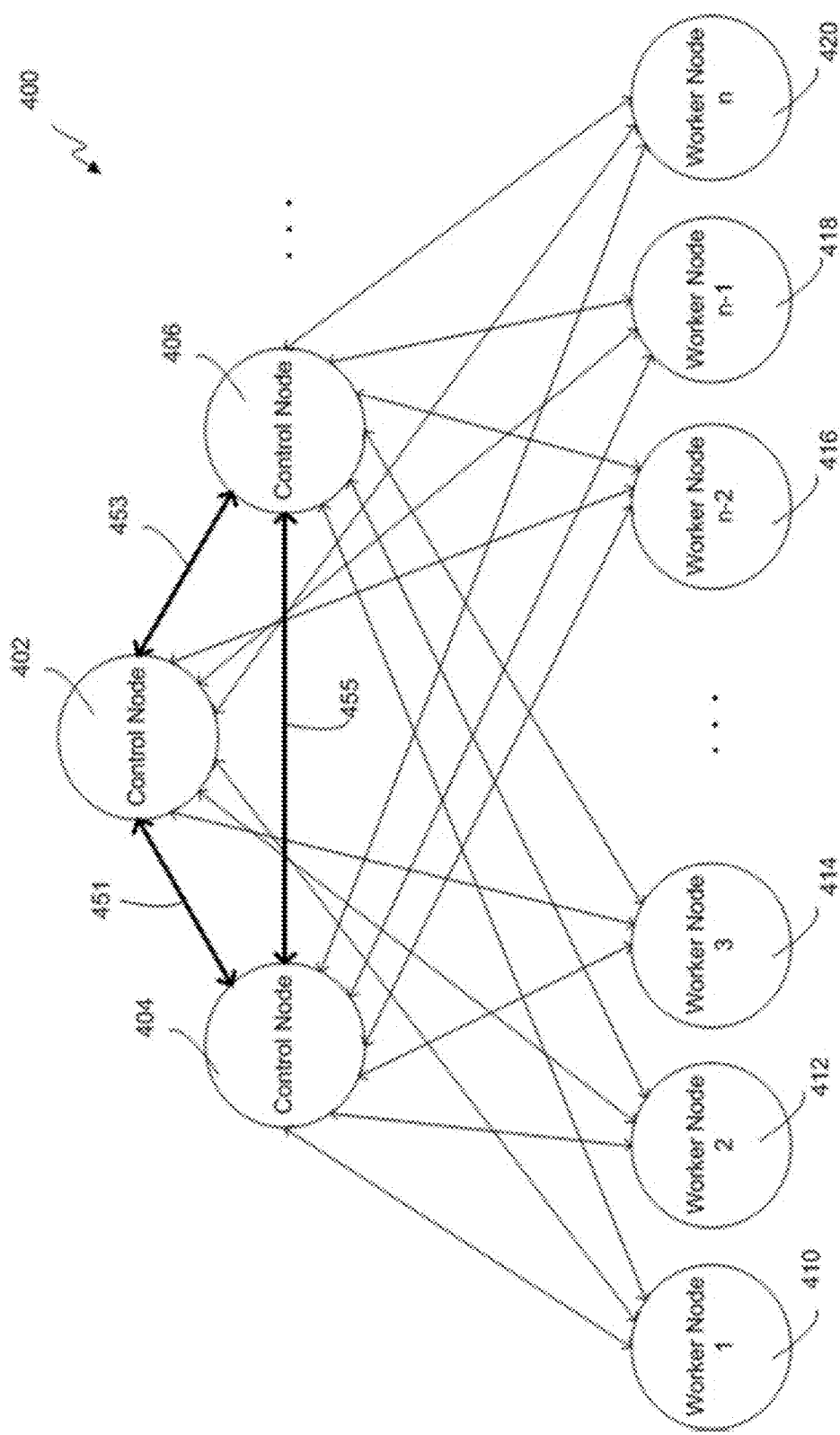
FIG. 4 is a hierarchical diagram of an example of a communications grid computing system including a variety of control and worker nodes according to some aspects.

FIG. 4 is a hierarchical diagram of an example of a communications grid computing system 400 including a variety of control and worker nodes according to some aspects. Communications grid computing system 400 includes three control nodes and one or more worker nodes. Communications grid computing system 400 includes control nodes 402, 404, and 406. The control nodes are communicatively connected via communication paths 451, 453, and 455. The control nodes 402-406 may transmit information (e.g., related to the communications grid or notifications) to and receive information from each other. Although communications grid computing system 400 is shown in FIG. 4 as including three control nodes, the communications grid may include more or less than three control nodes.

Communications grid computing system 400 (which can be referred to as a "communications grid") also includes one or more worker nodes. Shown in FIG. 4 are six worker nodes 410-420. Although FIG. 4 shows six worker nodes, a communications grid can include more or less than six worker nodes. The number of worker nodes included in a communications grid may be dependent upon how large the project or data set is being processed by the communications grid, the capacity of each worker node, the time designated for the communications grid to complete the project, among others. Each worker node within the communications grid computing system 400 may be connected (wired or wirelessly, and directly or indirectly) to control nodes 402-406. Each worker node may receive information from the control nodes (e.g., an instruction to perform work on a project) and may transmit information to the control nodes (e.g., a result from work performed on a project). Furthermore, worker nodes may communicate with each other directly or indirectly. For example, worker nodes may transmit data between each other related to a modeling job being performed or an individual task within a modeling job being performed by that worker node. In some examples, worker nodes may not be connected (communicatively or otherwise) to certain other worker nodes. For example, a worker node 410 may only be able to communicate with a particular control node 402. The worker node 410 may be unable to communicate with other worker nodes 412-420 in the communications grid, even if the other worker nodes 412-420 are controlled by the same control node 402.

A control node 402-406 may connect with an external device with which the control node 402-406 may communicate (e.g., a communications grid user, such as a server or computer, may connect to a controller of the grid). For example, a server or computer may connect to control nodes 402-406 and may transmit a project or job to the node, such as a modeling project in which a model is generated from a data set. The project may include the data set. The data set may be of any size. Once the control node 402-406 receives such a project including a large data set, the control node may distribute the data set or projects related to the data set to be performed by worker nodes. Alternatively, for a project including a large data set, the data set may be receive or stored by a machine other than a control node 402-406 (e.g., a Hadoop data node).

Control nodes 402-406 can maintain knowledge of the status of the nodes in the grid (e.g., grid status information), accept work requests from clients, subdivide the work across worker nodes, and coordinate the worker nodes, among other responsibilities. Worker nodes 412-420 may accept work requests from a control node 402-406 and provide the control node with results of the work performed by the worker node. A grid may be started from a single node (e.g., a machine, computer, server, etc.). This first node may be assigned or may start as the primary control node 402 that will control any additional nodes that enter the grid.

When a project is submitted for execution (e.g., by a client or a controller of the grid) it may be assigned to a set of nodes. After the nodes are assigned to a project, a data structure (e.g., a communicator) may be created. The communicator may be used by the project for information to be shared between the project code running on each node. A communication handle may be created on each node. A handle, for example, is a reference to the communicator that is valid within a single process on a single node, and the handle may be used when requesting communications between nodes.

A control node, such as control node 402, may be designated as the primary control node. A server, computer or other external device may connect to the primary control node. Once the control node 402 receives a project, the primary control node may distribute portions of the project to its worker nodes for execution. For example, a project for generating a model or using a model can be initiated on communications grid computing system 400. A primary control node can control the work to be performed for the project in order to complete the project as requested or instructed. The primary control node may distribute work to the worker nodes 412-420 based on various factors, such as which subsets or portions of projects may be completed most efficiently and in the correct amount of time. For example, a worker node 412 may generate a model using at least a portion of data that is already local (e.g., stored on) the worker node. The primary control node also coordinates and processes the results of the work performed by each worker node 412-420 after each worker node 412-420 executes and completes its job. For example, the primary control node may receive a result from one or more worker nodes 412-420, and the primary control node may organize (e.g., collect and assemble) the results received and compile them to produce a complete result for the project received from the end user.

Any remaining control nodes, such as control nodes 404, 406, may be assigned as backup control nodes for the project. In an example, backup control nodes may not control any portion of the project. Instead, backup control nodes may serve as a backup for the primary control node and take over as primary control node if the primary control node were to fail. If a communications grid were to include only a single control node 402, and the control node 402 were to fail (e.g., the control node is shut off or breaks) then the communications grid as a whole may fail and any project or job being run on the communications grid may fail and may not complete. While the project may be run again, such a failure may cause a delay (severe delay in some cases, such as overnight delay) in completion of the project. Therefore, a grid with multiple control nodes 402-406, including a backup control node, may be beneficial.

In some examples, the primary control node may open a pair of listening sockets to add another node or machine to the grid. A socket may be used to accept work requests from clients, and the second socket may be used to accept connections from other grid nodes. The primary control node may be provided with a list of other nodes (e.g., other machines, computers, servers, etc.) that can participate in the grid, and the role that each node can fill in the grid. Upon startup of the primary control node (e.g., the first node on the grid), the primary control node may use a network protocol to start the server process on every other node in the grid. Command line parameters, for example, may inform each node of one or more pieces of information, such as: the role that the node will have in the grid, the host name of the primary control node, the port number on which the primary control node is accepting connections from peer nodes, among others. The information may also be provided in a configuration file, transmitted over a secure shell tunnel, recovered from a configuration server, among others. While the other machines in the grid may not initially know about the configuration of the grid, that information may also be sent to each other node by the primary control node. Updates of the grid information may also be subsequently sent to those nodes.

For any control node other than the primary control node added to the grid, the control node may open three sockets. The first socket may accept work requests from clients, the second socket may accept connections from other grid members, and the third socket may connect (e.g., permanently) to the primary control node. When a control node (e.g., primary control node) receives a connection from another control node, it first checks to see if the peer node is in the list of configured nodes in the grid. If it is not on the list, the control node may clear the connection. If it is on the list, it may then attempt to authenticate the connection. If authentication is successful, the authenticating node may transmit information to its peer, such as the port number on which a node is listening for connections, the host name of the node, information about how to authenticate the node, among other information. When a node, such as the new control node, receives information about another active node, it can check to see if it already has a connection to that other node. If it does not have a connection to that node, it may then establish a connection to that control node.

Any worker node added to the grid may establish a connection to the primary control node and any other control nodes on the grid. After establishing the connection, it may authenticate itself to the grid (e.g., any control nodes, including both primary and backup, or a server or user controlling the grid). After successful authentication, the worker node may accept configuration information from the control node.

When a node joins a communications grid (e.g., when the node is powered on or connected to an existing node on the grid or both), the node is assigned (e.g., by an operating system of the grid) a universally unique identifier (UUID). This unique identifier may help other nodes and external entities (devices, users, etc.) to identify the node and distinguish it from other nodes. When a node is connected to the grid, the node may share its unique identifier with the other nodes in the grid. Since each node may share its unique identifier, each node may know the unique identifier of every other node on the grid. Unique identifiers may also designate a hierarchy of each of the nodes (e.g., backup control nodes) within the grid. For example, the unique identifiers of each of the backup control nodes may be stored in a list of backup control nodes to indicate an order in which the backup control nodes will take over for a failed primary control node to become a new primary control node. But, a hierarchy of nodes may also be determined using methods other than using the unique identifiers of the nodes. For example, the hierarchy may be predetermined, or may be assigned based on other predetermined factors.

The grid may add new machines at any time (e.g., initiated from any control node). Upon adding a new node to the grid, the control node may first add the new node to its table of grid nodes. The control node may also then notify every other control node about the new node. The nodes receiving the notification may acknowledge that they have updated their configuration information.

Primary control node 402 may, for example, transmit one or more communications to backup control nodes 404, 406 (and, for example, to other control or worker nodes 412-420 within the communications grid). Such communications may be sent periodically, at fixed time intervals, between known fixed stages of the project's execution, among other protocols. The communications transmitted by primary control node 402 may be of varied types and may include a variety of types of information. For example, primary control node 402 may transmit snapshots (e.g., status information) of the communications grid so that backup control node 404 always has a recent snapshot of the communications grid. The snapshot or grid status may include, for example, the structure of the grid (including, for example, the worker nodes 410-420 in the communications grid, unique identifiers of the worker nodes 410-420, or their relationships with the primary control node 402) and the status of a project (including, for example, the status of each worker node's portion of the project). The snapshot may also include analysis or results received from worker nodes 410-420 in the communications grid. The backup control nodes 404, 406 may receive and store the backup data received from the primary control node 402. The backup control nodes 404, 406 may transmit a request for such a snapshot (or other information) from the primary control node 402, or the primary control node 402 may send such information periodically to the backup control nodes 404, 406.

As noted, the backup data may allow a backup control node 404, 406 to take over as primary control node if the primary control node 402 fails without requiring the communications grid to start the project over from scratch. If the primary control node 402 fails, the backup control node 404, 406 that will take over as primary control node may retrieve the most recent version of the snapshot received from the primary control node 402 and use the snapshot to continue the project from the stage of the project indicated by the backup data. This may prevent failure of the project as a whole.

A backup control node 404, 406 may use various methods to determine that the primary control node 402 has failed. In one example of such a method, the primary control node 402 may transmit (e.g., periodically) a communication to the backup control node 404, 406 that indicates that the primary control node 402 is working and has not failed, such as a heartbeat communication. The backup control node 404, 406 may determine that the primary control node 402 has failed if the backup control node has not received a heartbeat communication for a certain predetermined period of time. Alternatively, a backup control node 404, 406 may also receive a communication from the primary control node 402 itself (before it failed) or from a worker node 410-420 that the primary control node 402 has failed, for example because the primary control node 402 has failed to communicate with the worker node 410-420.

Different methods may be performed to determine which backup control node of a set of backup control nodes (e.g., backup control nodes 404, 406) can take over for failed primary control node 402 and become the new primary control node. For example, the new primary control node may be chosen based on a ranking or "hierarchy" of backup control nodes based on their unique identifiers. In an alternative example, a backup control node may be assigned to be the new primary control node by another device in the communications grid or from an external device (e.g., a system infrastructure or an end user, such as a server or computer, controlling the communications grid). In another alternative example, the backup control node that takes over as the new primary control node may be designated based on bandwidth or other statistics about the communications grid.

A worker node within the communications grid may also fail. If a worker node fails, work being performed by the failed worker node may be redistributed amongst the operational worker nodes. In an alternative example, the primary control node may transmit a communication to each of the operable worker nodes still on the communications grid that each of the worker nodes should purposefully fail also. After each of the worker nodes fail, they may each retrieve their most recent saved checkpoint of their status and re-start the project from that checkpoint to minimize lost progress on the project being executed. In some examples, a communications grid computing system 400 can be used to generate a model or use a model.

Figure 5:
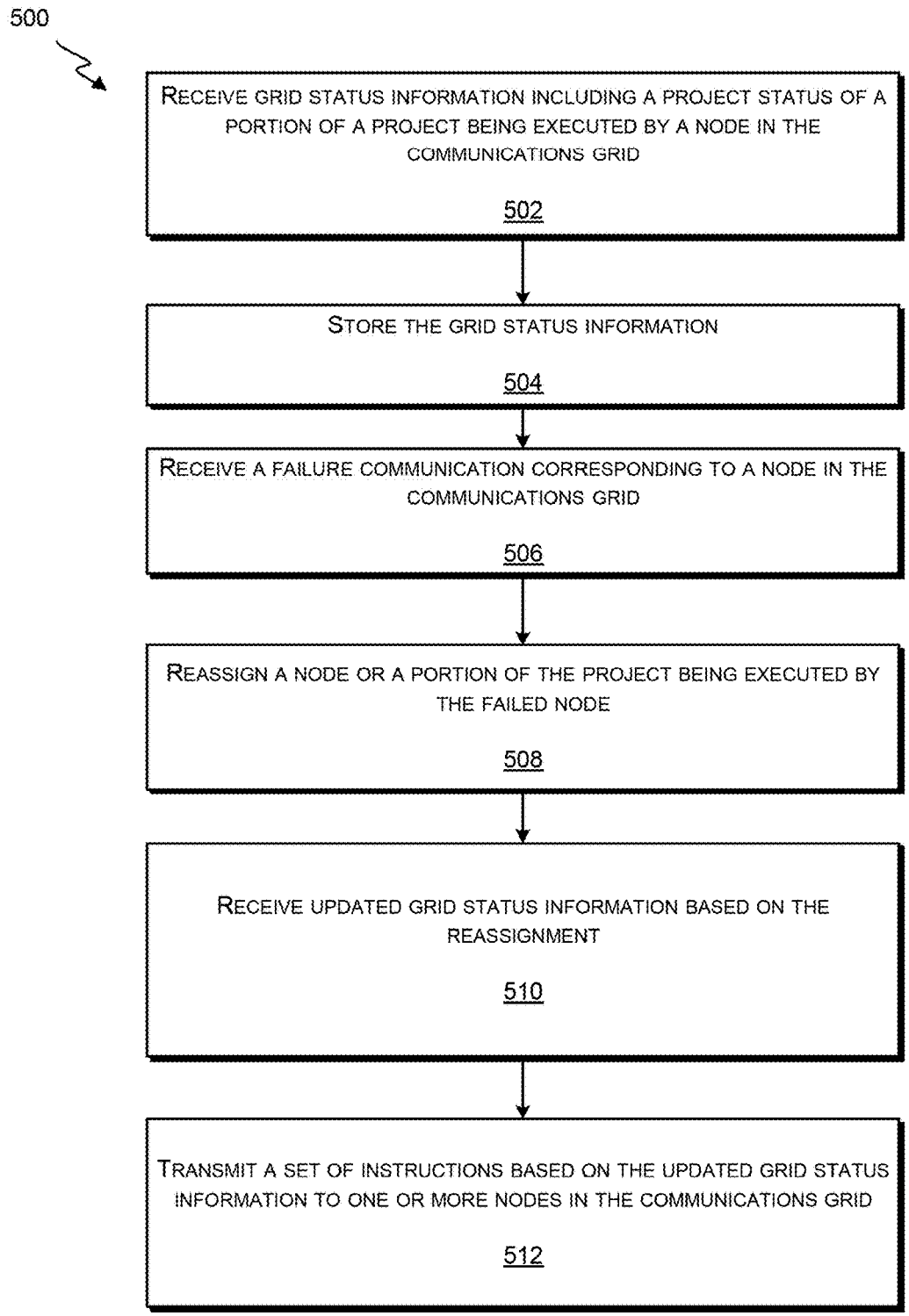
FIG. 5 is a flow chart of an example of a process for adjusting a communications grid or a work project in a communications grid after a failure of a node according to some aspects.

FIG. 5 is a flow chart of an example of a process for adjusting a communications grid or a work project in a communications grid after a failure of a node according to some aspects. The process may include, for example, receiving grid status information including a project status of a portion of a project being executed by a node in the communications grid, as described in operation 502. For example, a control node (e.g., a backup control node connected to a primary control node and a worker node on a communications grid) may receive grid status information, where the grid status information includes a project status of the primary control node or a project status of the worker node. The project status of the primary control node and the project status of the worker node may include a status of one or more portions of a project being executed by the primary and worker nodes in the communications grid. The process may also include storing the grid status information, as described in operation 504. For example, a control node (e.g., a backup control node) may store the received grid status information locally within the control node. Alternatively, the grid status information may be sent to another device for storage where the control node may have access to the information.

The process may also include receiving a failure communication corresponding to a node in the communications grid in operation 506. For example, a node may receive a failure communication including an indication that the primary control node has failed, prompting a backup control node to take over for the primary control node. In an alternative embodiment, a node may receive a failure that a worker node has failed, prompting a control node to reassign the work being performed by the worker node. The process may also include reassigning a node or a portion of the project being executed by the failed node, as described in operation 508. For example, a control node may designate the backup control node as a new primary control node based on the failure communication upon receiving the failure communication. If the failed node is a worker node, a control node may identify a project status of the failed worker node using the snapshot of the communications grid, where the project status of the failed worker node includes a status of a portion of the project being executed by the failed worker node at the failure time.

The process may also include receiving updated grid status information based on the reassignment, as described in operation 510, and transmitting a set of instructions based on the updated grid status information to one or more nodes in the communications grid, as described in operation 512. The updated grid status information may include an updated project status of the primary control node or an updated project status of the worker node. The updated information may be transmitted to the other nodes in the grid to update their stale stored information.

Figure 6:
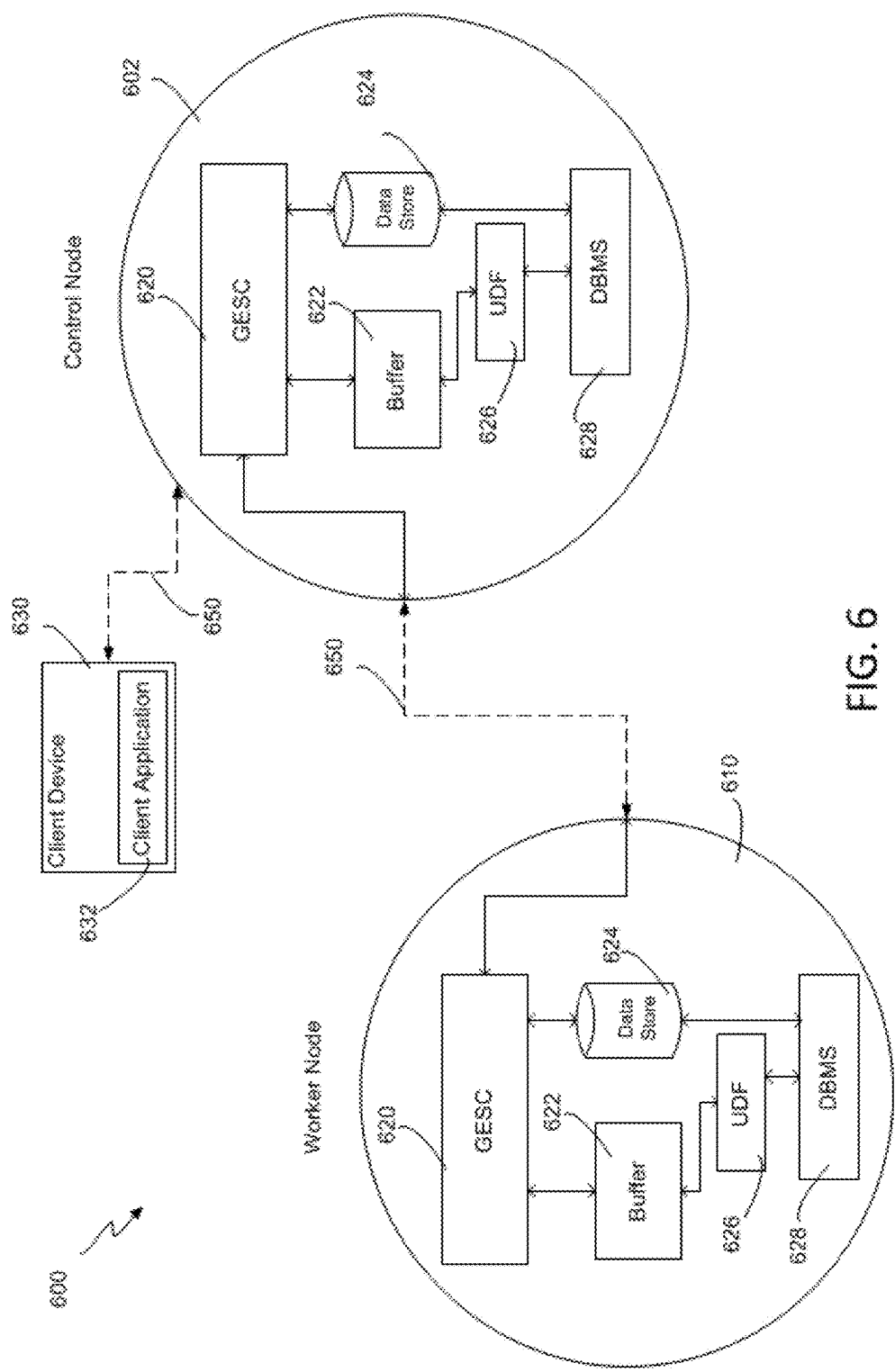
FIG. 6 is a block diagram of a portion of a communications grid computing system including a control node and a worker node according to some aspects.

FIG. 6 is a block diagram of a portion of a communications grid computing system 600 including a control node and a worker node according to some aspects. Communications grid 600 computing system includes one control node (control node 602) and one worker node (worker node 610) for purposes of illustration, but may include more worker and/or control nodes. The control node 602 is communicatively connected to worker node 610 via a communication path 650. Therefore, control node 602 may transmit information (e.g., related to the communications grid or notifications), to and receive information from worker node 610 via communication path 650.

Similar to in FIG. 4, communications grid computing system (or just "communications grid") 600 includes data processing nodes (control node 602 and worker node 610). Nodes 602 and 610 comprise multi-core data processors. Each node 602 and 610 includes a grid-enabled software component (GESC) 620 that executes on the data processor associated with that node and interfaces with buffer memory 622 also associated with that node. Each node 602 and 610 includes a database management software (DBMS) 628 that executes on a database server (not shown) at control node 602 and on a database server (not shown) at worker node 610.

Each node also includes a data store 624. Data stores 624, similar to network-attached data stores 110 in FIG. 1 and data stores 235 in FIG. 2, are used to store data to be processed by the nodes in the computing environment. Data stores 624 may also store any intermediate or final data generated by the computing system after being processed, for example in non-volatile memory. However in certain examples, the configuration of the grid computing environment allows its operations to be performed such that intermediate and final data results can be stored solely in volatile memory (e.g., RAM), without a requirement that intermediate or final data results be stored to non-volatile types of memory. Storing such data in volatile memory may be useful in certain situations, such as when the grid receives queries (e.g., ad hoc) from a client and when responses, which are generated by processing large amounts of data, need to be generated quickly or on-the-fly. In such a situation, the grid may be configured to retain the data within memory so that responses can be generated at different levels of detail and so that a client may interactively query against this information.

Each node also includes a user-defined function (UDF) 626. The UDF provides a mechanism for the DMBS 628 to transfer data to or receive data from the database stored in the data stores 624 that are managed by the DBMS. For example, UDF 626 can be invoked by the DBMS to provide data to the GESC for processing. The UDF 626 may establish a socket connection (not shown) with the GESC to transfer the data. Alternatively, the UDF 626 can transfer data to the GESC by writing data to shared memory accessible by both the UDF and the GESC.

The GESC 620 at the nodes 602 and 610 may be connected via a network, such as network 108 shown in FIG. 1. Therefore, nodes 602 and 610 can communicate with each other via the network using a predetermined communication protocol such as, for example, the Message Passing Interface (MPI). Each GESC 620 can engage in point-to-point communication with the GESC at another node or in collective communication with multiple GESCs via the network. The GESC 620 at each node may contain identical (or nearly identical) software instructions. Each node may be capable of operating as either a control node or a worker node. The GESC at the control node 602 can communicate, over a communication path 652, with a client device 630. More specifically, control node 602 may communicate with client application 632 hosted by the client device 630 to receive queries and to respond to those queries after processing large amounts of data.

DMBS 628 may control the creation, maintenance, and use of database or data structure (not shown) within nodes 602 or 610. The database may organize data stored in data stores 624. The DMBS 628 at control node 602 may accept requests for data and transfer the appropriate data for the request. With such a process, collections of data may be distributed across multiple physical locations. In this example, each node 602 and 610 stores a portion of the total data managed by the management system in its associated data store 624.

Furthermore, the DBMS may be responsible for protecting against data loss using replication techniques. Replication includes providing a backup copy of data stored on one node on one or more other nodes. Therefore, if one node fails, the data from the failed node can be recovered from a replicated copy residing at another node. However, as described herein with respect to FIG. 4, data or status information for each node in the communications grid may also be shared with each node on the grid.

Figure 7:
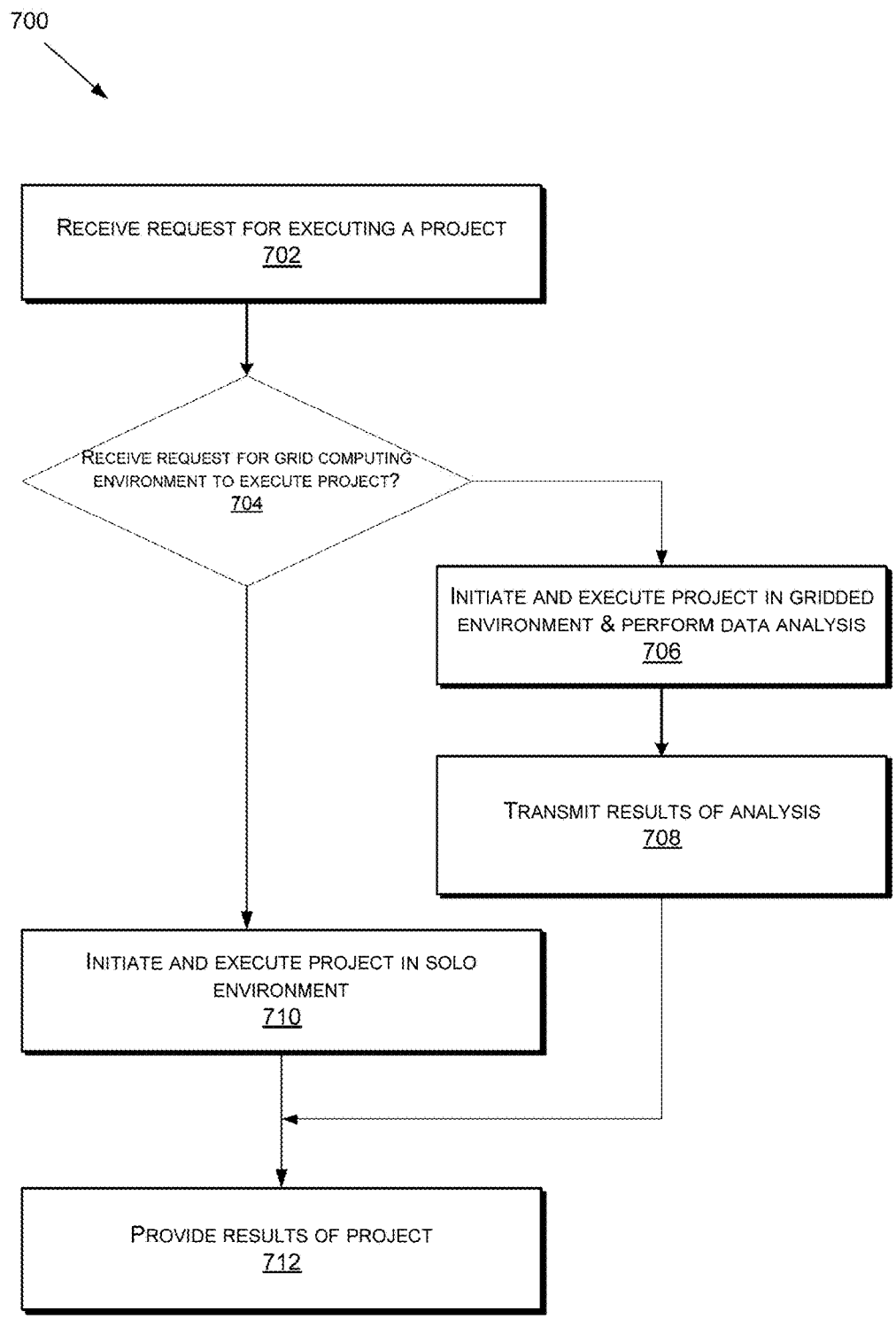
FIG. 7 is a flow chart of an example of a process for executing a data analysis or processing project according to some aspects.

FIG. 7 is a flow chart of an example of a process for executing a data analysis or a processing project according to some aspects. As described with respect to FIG. 6, the GESC at the control node may transmit data with a client device (e.g., client device 630) to receive queries for executing a project and to respond to those queries after large amounts of data have been processed. The query may be transmitted to the control node, where the query may include a request for executing a project, as described in operation 702. The query can contain instructions on the type of data analysis to be performed in the project and whether the project should be executed using the grid-based computing environment, as shown in operation 704.

To initiate the project, the control node may determine if the query requests use of the grid-based computing environment to execute the project. If the determination is no, then the control node initiates execution of the project in a solo environment (e.g., at the control node), as described in operation 710. If the determination is yes, the control node may initiate execution of the project in the grid-based computing environment, as described in operation 706. In such a situation, the request may include a requested configuration of the grid. For example, the request may include a number of control nodes and a number of worker nodes to be used in the grid when executing the project. After the project has been completed, the control node may transmit results of the analysis yielded by the grid, as described in operation 708. Whether the project is executed in a solo or grid-based environment, the control node provides the results of the project.

As noted with respect to FIG. 2, the computing environments described herein may collect data (e.g., as received from network devices, such as sensors, such as network devices 204-209 in FIG. 2, and client devices or other sources) to be processed as part of a data analytics project, and data may be received in real time as part of a streaming analytics environment (e.g., ESP). Data may be collected using a variety of sources as communicated via different kinds of networks or locally, such as on a real-time streaming basis. For example, network devices may receive data periodically from network device sensors as the sensors continuously sense, monitor and track changes in their environments. More specifically, an increasing number of distributed applications develop or produce continuously flowing data from distributed sources by applying queries to the data before distributing the data to geographically distributed recipients. An event stream processing engine (ESPE) may continuously apply the queries to the data as it is received and determines which entities should receive the data. Client or other devices may also subscribe to the ESPE or other devices processing ESP data so that they can receive data after processing, based on for example the entities determined by the processing engine. For example, client devices 230 in FIG. 2 may subscribe to the ESPE in computing environment 214. In another example, event subscription devices 1024a-c, described further with respect to FIG. 10, may also subscribe to the ESPE. The ESPE may determine or define how input data or event streams from network devices or other publishers (e.g., network devices 204-209 in FIG. 2) are transformed into meaningful output data to be consumed by subscribers, such as for example client devices 230 in FIG. 2.

Figure 8:
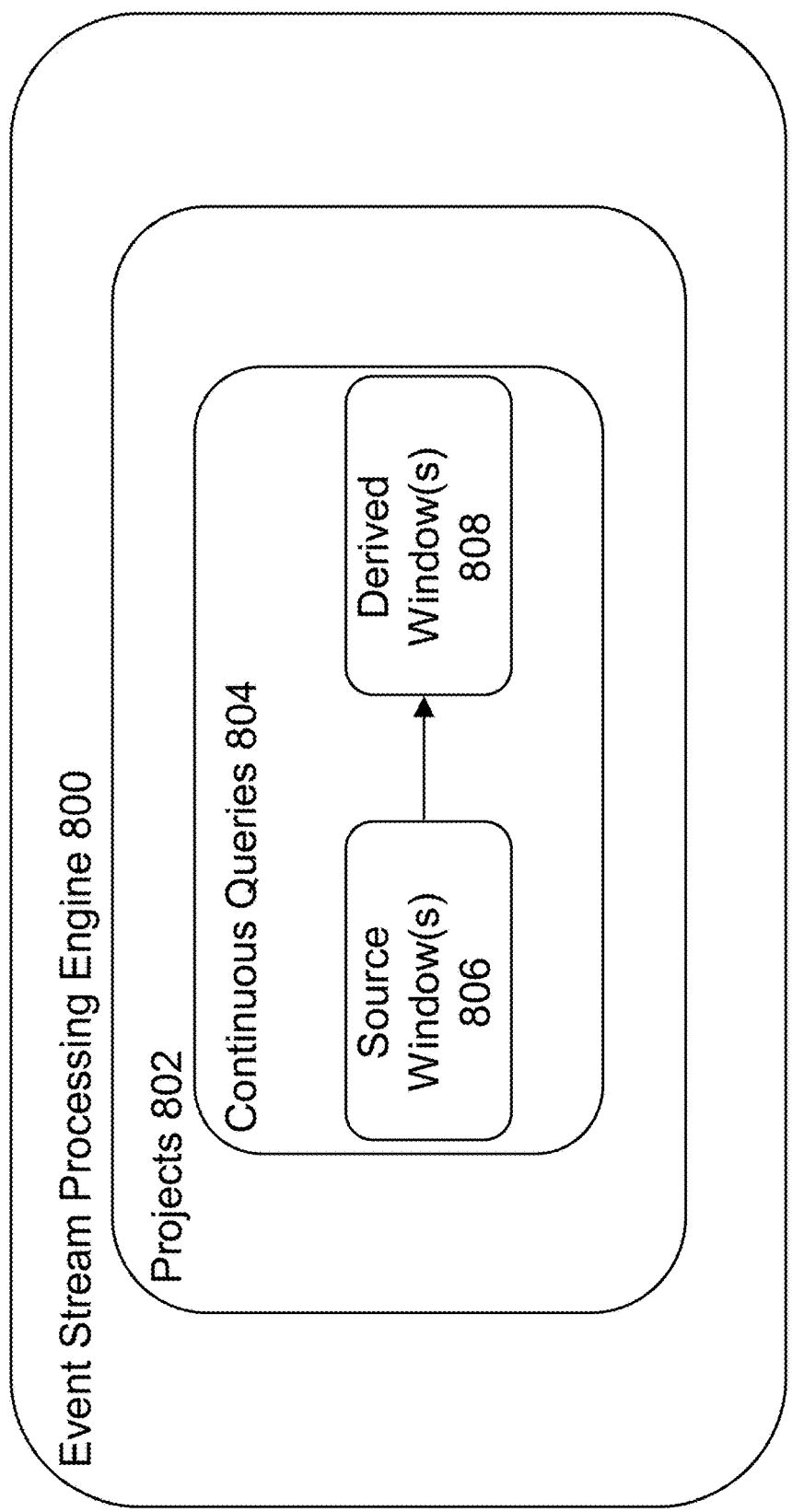
FIG. 8 is a block diagram including components of an Event Stream Processing Engine (ESPE) according to some aspects.

FIG. 8 is a block diagram including components of an Event Stream Processing Engine (ESPE) according to some aspects. ESPE 800 may include one or more projects 802. A project may be described as a second-level container in an engine model managed by ESPE 800 where a thread pool size for the project may be defined by a user. Each project of the one or more projects 802 may include one or more continuous queries 804 that contain data flows, which are data transformations of incoming event streams. The one or more continuous queries 804 may include one or more source windows 806 and one or more derived windows 808.

The ESPE may receive streaming data over a period of time related to certain events, such as events or other data sensed by one or more network devices. The ESPE may perform operations associated with processing data created by the one or more devices. For example, the ESPE may receive data from the one or more network devices 204-209 shown in FIG. 2. As noted, the network devices may include sensors that sense different aspects of their environments, and may collect data over time based on those sensed observations. For example, the ESPE may be implemented within one or more of machines 220 and 240 shown in FIG. 2. The ESPE may be implemented within such a machine by an ESP application. An ESP application may embed an ESPE with its own dedicated thread pool or pools into its application space where the main application thread can do application-specific work and the ESPE processes event streams at least by creating an instance of a model into processing objects.

The engine container is the top-level container in a model that manages the resources of the one or more projects 802. In an illustrative example, there may be only one ESPE 800 for each instance of the ESP application, and ESPE 800 may have a unique engine name. Additionally, the one or more projects 802 may each have unique project names, and each query may have a unique continuous query name and begin with a uniquely named source window of the one or more source windows 806. ESPE 800 may or may not be persistent.

Continuous query modeling involves defining directed graphs of windows for event stream manipulation and transformation. A window in the context of event stream manipulation and transformation is a processing node in an event stream processing model. A window in a continuous query can perform aggregations, computations, pattern-matching, and other operations on data flowing through the window. A continuous query may be described as a directed graph of source, relational, pattern matching, and procedural windows. The one or more source windows 806 and the one or more derived windows 808 represent continuously executing queries that generate updates to a query result set as new event blocks stream through ESPE 800. A directed graph, for example, is a set of nodes connected by edges, where the edges have a direction associated with them.

An event object may be described as a packet of data accessible as a collection of fields, with at least one of the fields defined as a key or unique identifier (ID). The event object may be created using a variety of formats including binary, alphanumeric, XML, etc. Each event object may include one or more fields designated as a primary identifier (ID) for the event so ESPE 800 can support operation codes (opcodes) for events including insert, update, upsert, and delete. Upsert opcodes update the event if the key field already exists; otherwise, the event is inserted. For illustration, an event object may be a packed binary representation of a set of field values and include both metadata and field data associated with an event. The metadata may include an opcode indicating if the event represents an insert, update, delete, or upsert, a set of flags indicating if the event is a normal, partial-update, or a retention generated event from retention policy management, and a set of microsecond timestamps that can be used for latency measurements.

An event block object may be described as a grouping or package of event objects. An event stream may be described as a flow of event block objects. A continuous query of the one or more continuous queries 804 transforms a source event stream made up of streaming event block objects published into ESPE 800 into one or more output event streams using the one or more source windows 806 and the one or more derived windows 808. A continuous query can also be thought of as data flow modeling.

The one or more source windows 806 are at the top of the directed graph and have no windows feeding into them. Event streams are published into the one or more source windows 806, and from there, the event streams may be directed to the next set of connected windows as defined by the directed graph. The one or more derived windows 808 are all instantiated windows that are not source windows and that have other windows streaming events into them. The one or more derived windows 808 may perform computations or transformations on the incoming event streams. The one or more derived windows 808 transform event streams based on the window type (that is operators such as join, filter, compute, aggregate, copy, pattern match, procedural, union, etc.) and window settings. As event streams are published into ESPE 800, they are continuously queried, and the resulting sets of derived windows in these queries are continuously updated.

Figure 9:
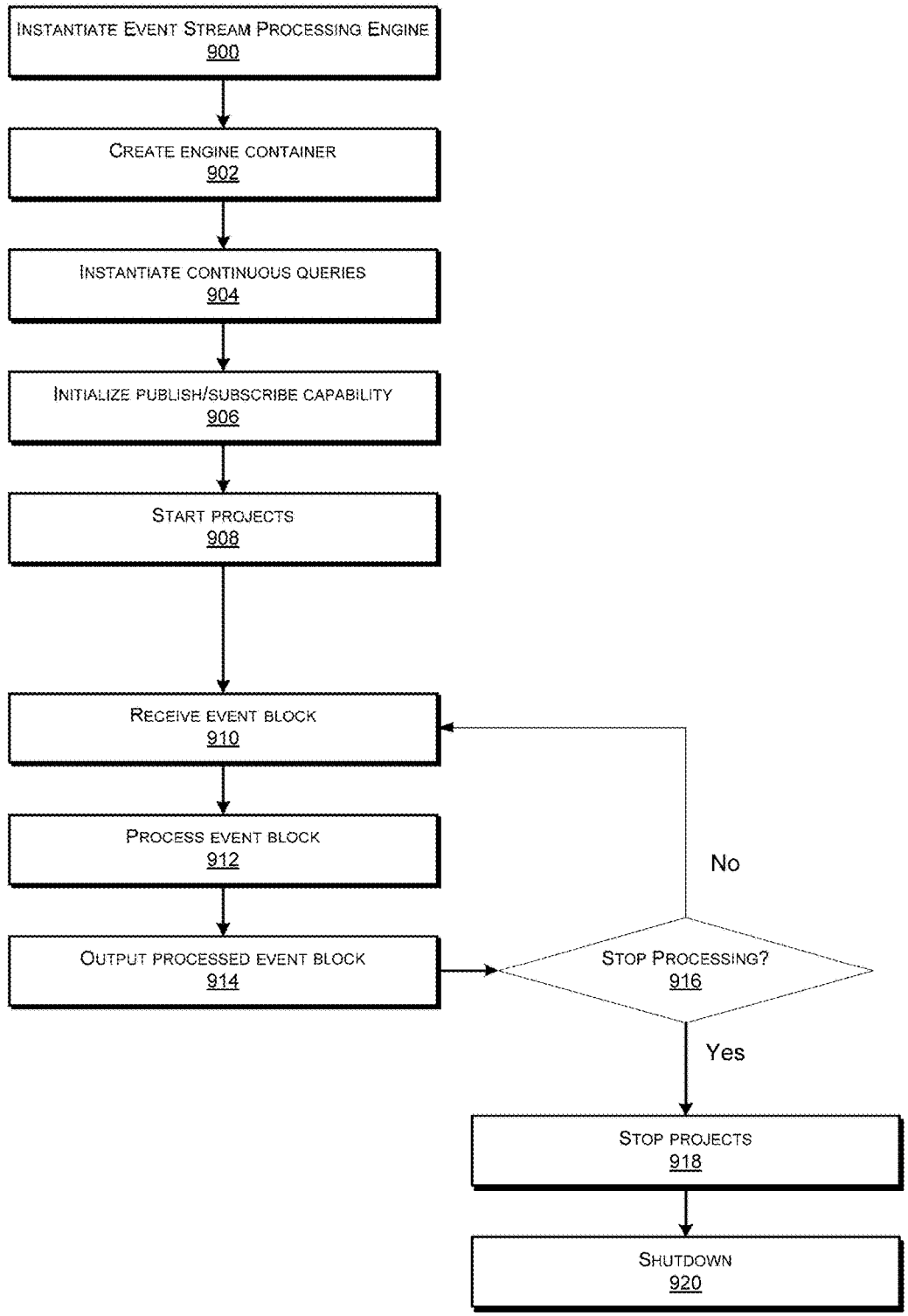
FIG. 9 is a flow chart of an example of a process including operations performed by an event stream processing engine according to some aspects.

FIG. 9 is a flow chart of an example of a process including operations performed by an event stream processing engine according to some aspects. As noted, the ESPE 800 (or an associated ESP application) defines how input event streams are transformed into meaningful output event streams. More specifically, the ESP application may define how input event streams from publishers (e.g., network devices providing sensed data) are transformed into meaningful output event streams consumed by subscribers (e.g., a data analytics project being executed by a machine or set of machines).

Within the application, a user may interact with one or more user interface windows presented to the user in a display under control of the ESPE independently or through a browser application in an order selectable by the user. For example, a user may execute an ESP application, which causes presentation of a first user interface window, which may include a plurality of menus and selectors such as drop down menus, buttons, text boxes, hyperlinks, etc. associated with the ESP application as understood by a person of skill in the art. Various operations may be performed in parallel, for example, using a plurality of threads.

At operation 900, an ESP application may define and start an ESPE, thereby instantiating an ESPE at a device, such as machine 220 and/or 240. In an operation 902, the engine container is created. For illustration, ESPE 800 may be instantiated using a function call that specifies the engine container as a manager for the model.

In an operation 904, the one or more continuous queries 804 are instantiated by ESPE 800 as a model. The one or more continuous queries 804 may be instantiated with a dedicated thread pool or pools that generate updates as new events stream through ESPE 800. For illustration, the one or more continuous queries 804 may be created to model business processing logic within ESPE 800, to predict events within ESPE 800, to model a physical system within ESPE 800, to predict the physical system state within ESPE 800, etc. For example, as noted, ESPE 800 may be used to support sensor data monitoring and management (e.g., sensing may include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, or electrical current, etc.).

ESPE 800 may analyze and process events in motion or "event streams." Instead of storing data and running queries against the stored data, ESPE 800 may store queries and stream data through them to allow continuous analysis of data as it is received. The one or more source windows 806 and the one or more derived windows 808 may be created based on the relational, pattern matching, and procedural algorithms that transform the input event streams into the output event streams to model, simulate, score, test, predict, etc. based on the continuous query model defined and application to the streamed data.

In an operation 906, a publish/subscribe (pub/sub) capability is initialized for ESPE 800. In an illustrative embodiment, a pub/sub capability is initialized for each project of the one or more projects 802. To initialize and enable pub/sub capability for ESPE 800, a port number may be provided. Pub/sub clients can use a host name of an ESP device running the ESPE and the port number to establish pub/sub connections to ESPE 800.

Figure 10:
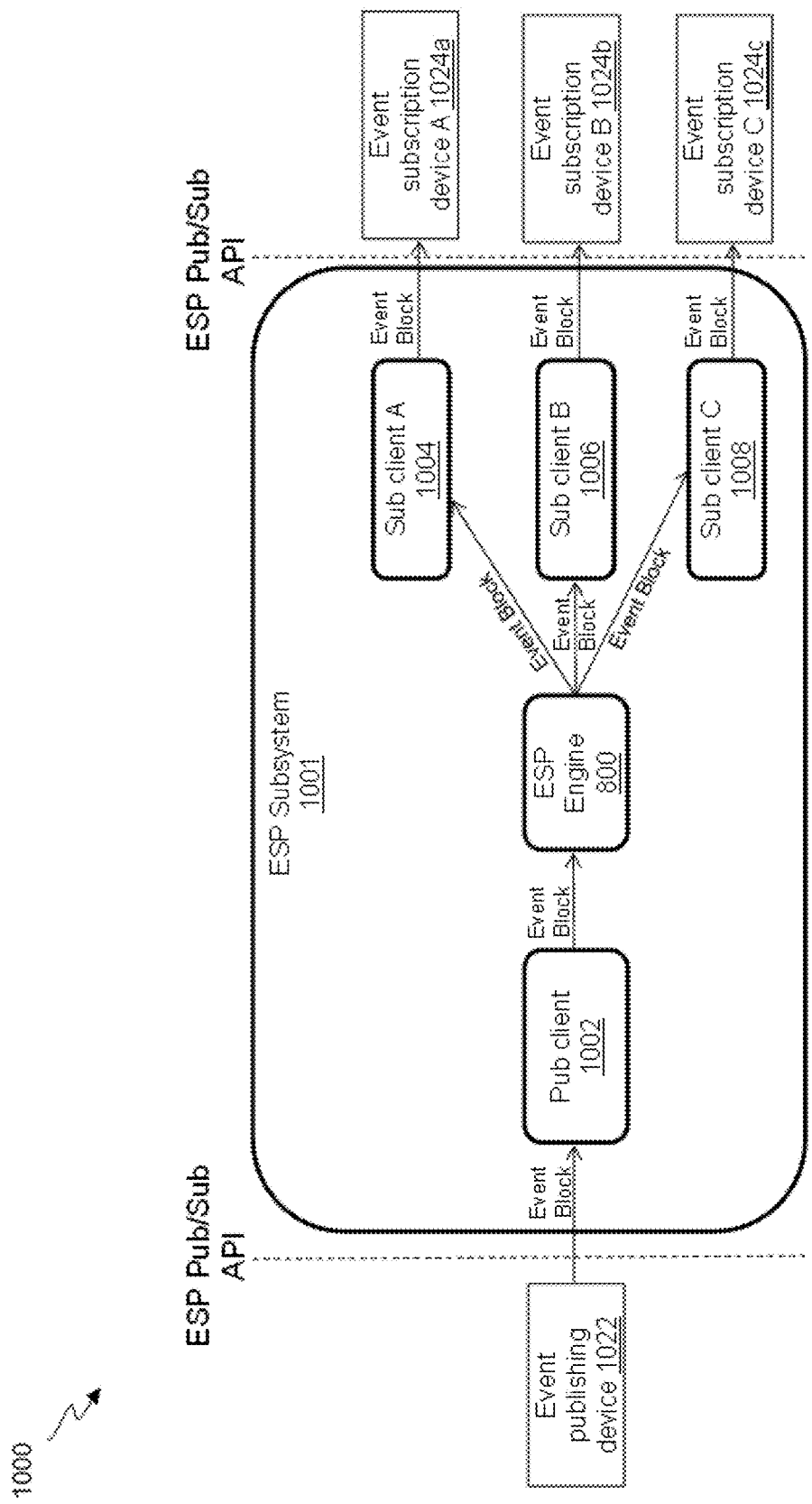
FIG. 10 is a block diagram of an ESP system interfacing between a publishing device and multiple event subscribing devices according to some aspects.

FIG. 10 is a block diagram of an ESP system 1000 interfacing between publishing device 1022 and event subscribing devices 1024a-c according to some aspects. ESP system 1000 may include ESP device or subsystem 1001, publishing device 1022, an event subscribing device A 1024a, an event subscribing device B 1024b, and an event subscribing device C 1024c. Input event streams are output to ESP device 1001 by publishing device 1022. In alternative embodiments, the input event streams may be created by a plurality of publishing devices. The plurality of publishing devices further may publish event streams to other ESP devices. The one or more continuous queries instantiated by ESPE 800 may analyze and process the input event streams to form output event streams output to event subscribing device A 1024a, event subscribing device B 1024b, and event subscribing device C 1024c. ESP system 1000 may include a greater or a fewer number of event subscribing devices of event subscribing devices.

Publish-subscribe is a message-oriented interaction paradigm based on indirect addressing. Processed data recipients specify their interest in receiving information from ESPE 800 by subscribing to specific classes of events, while information sources publish events to ESPE 800 without directly addressing the receiving parties. ESPE 800 coordinates the interactions and processes the data. In some cases, the data source receives confirmation that the published information has been received by a data recipient.

A publish/subscribe API may be described as a library that enables an event publisher, such as publishing device 1022, to publish event streams into ESPE 800 or an event subscriber, such as event subscribing device A 1024a, event subscribing device B 1024b, and event subscribing device C 1024c, to subscribe to event streams from ESPE 800. For illustration, one or more publish/subscribe APIs may be defined. Using the publish/subscribe API, an event publishing application may publish event streams into a running event stream processor project source window of ESPE 800, and the event subscription application may subscribe to an event stream processor project source window of ESPE 800.

The publish/subscribe API provides cross-platform connectivity and endianness compatibility between ESP application and other networked applications, such as event publishing applications instantiated at publishing device 1022, and event subscription applications instantiated at one or more of event subscribing device A 1024a, event subscribing device B 1024b, and event subscribing device C 1024c.

Referring back to FIG. 9, operation 906 initializes the publish/subscribe capability of ESPE 800. In an operation 908, the one or more projects 802 are started. The one or more started projects may run in the background on an ESP device. In an operation 910, an event block object is received from one or more computing device of the publishing device 1022.

ESP subsystem 800 may include a publishing client 1002, ESPE 800, a subscribing client A 1004, a subscribing client B 1006, and a subscribing client C 1008. Publishing client 1002 may be started by an event publishing application executing at publishing device 1022 using the publish/subscribe API. Subscribing client A 1004 may be started by an event subscription application A, executing at event subscribing device A 1024a using the publish/subscribe API. Subscribing client B 1006 may be started by an event subscription application B executing at event subscribing device B 1024b using the publish/subscribe API. Subscribing client C 1008 may be started by an event subscription application C executing at event subscribing device C 1024c using the publish/subscribe API.

An event block object containing one or more event objects is injected into a source window of the one or more source windows 806 from an instance of an event publishing application on publishing device 1022. The event block object may generated, for example, by the event publishing application and may be received by publishing client 1002. A unique ID may be maintained as the event block object is passed between the one or more source windows 806 and/or the one or more derived windows 808 of ESPE 800, and to subscribing client A 1004, subscribing client B 806, and subscribing client C 808 and to event subscription device A 1024*a*, event subscription device B 1024*b*, and event subscription device C 1024*c*. Publishing client 1002 may further generate and include a unique embedded transaction ID in the event block object as the event block object is processed by a continuous query, as well as the unique ID that publishing device 1022 assigned to the event block object.

In an operation 912, the event block object is processed through the one or more continuous queries 804. In an operation 914, the processed event block object is output to one or more computing devices of the event subscribing devices 1024*a-c*. For example, subscribing client A 804, subscribing client B 806, and subscribing client C 808 may send the received event block object to event subscription device A 1024*a*, event subscription device B 1024*b*, and event subscription device C 1024*c*, respectively.

ESPE 800 maintains the event block containership aspect of the received event blocks from when the event block is published into a source window and works its way through the directed graph defined by the one or more continuous queries 804 with the various event translations before being output to subscribers. Subscribers can correlate a group of subscribed events back to a group of published events by comparing the unique ID of the event block object that a publisher, such as publishing device 1022, attached to the event block object with the event block ID received by the subscriber.

In an operation 916, a determination is made concerning whether or not processing is stopped. If processing is not stopped, processing continues in operation 910 to continue receiving the one or more event streams containing event block objects from the, for example, one or more network devices. If processing is stopped, processing continues in an operation 918. In operation 918, the started projects are stopped. In operation 920, the ESPE is shutdown.

As noted, in some examples, big data is processed for an analytics project after the data is received and stored. In other examples, distributed applications process continuously flowing data in real-time from distributed sources by applying queries to the data before distributing the data to geographically distributed recipients. As noted, an event stream processing engine (ESPE) may continuously apply the queries to the data as it is received and determines which entities receive the processed data. This allows for large amounts of data being received and/or collected in a variety of environments to be processed and distributed in real time. For example, as shown with respect to FIG. 2, data may be collected from network devices that may include devices within the internet of things, such as devices within a home automation network. However, such data may be collected from a variety of different resources in a variety of different environments. In any such situation, embodiments of the present technology allow for real-time processing of such data.

Aspects of the present disclosure provide technical solutions to technical problems, such as computing problems that arise when an ESP device fails which results in a complete service interruption and potentially significant data loss. The data loss can be catastrophic when the streamed data is supporting mission critical operations, such as those in support of an ongoing manufacturing or drilling operation. An example of an ESP system achieves a rapid and seamless failover of ESPE running at the plurality of ESP devices without service interruption or data loss, thus significantly improving the reliability of an operational system that relies on the live or real-time processing of the data streams. The event publishing systems, the event subscribing systems, and each ESPE not executing at a failed ESP device are not aware of or effected by the failed ESP device. The ESP system may include thousands of event publishing systems and event subscribing systems. The ESP system keeps the failover logic and awareness within the boundaries of out-messaging network connector and out-messaging network device.

In one example embodiment, a system is provided to support a failover when event stream processing (ESP) event blocks. The system includes, but is not limited to, an out-messaging network device and a computing device. The computing device includes, but is not limited to, a processor and a computer-readable medium operably coupled to the processor. The processor is configured to execute an ESP engine (ESPE). The computer-readable medium has instructions stored thereon that, when executed by the processor, cause the computing device to support the failover. An event block object is received from the ESPE that includes a unique identifier. A first status of the computing device as active or standby is determined. When the first status is active, a second status of the computing device as newly active or not newly active is determined. Newly active is determined when the computing device is switched from a standby status to an active status. When the second status is newly active, a last published event block object identifier that uniquely identifies a last published event block object is determined. A next event block object is selected from a non-transitory computer-readable medium accessible by the computing device. The next event block object has an event block object identifier that is greater than the determined last published event block object identifier. The selected next event block object is published to an out-messaging network device. When the second status of the computing device is not newly active, the received event block object is published to the out-messaging network device. When the first status of the computing device is standby, the received event block object is stored in the non-transitory computer-readable medium.

Figure 11:
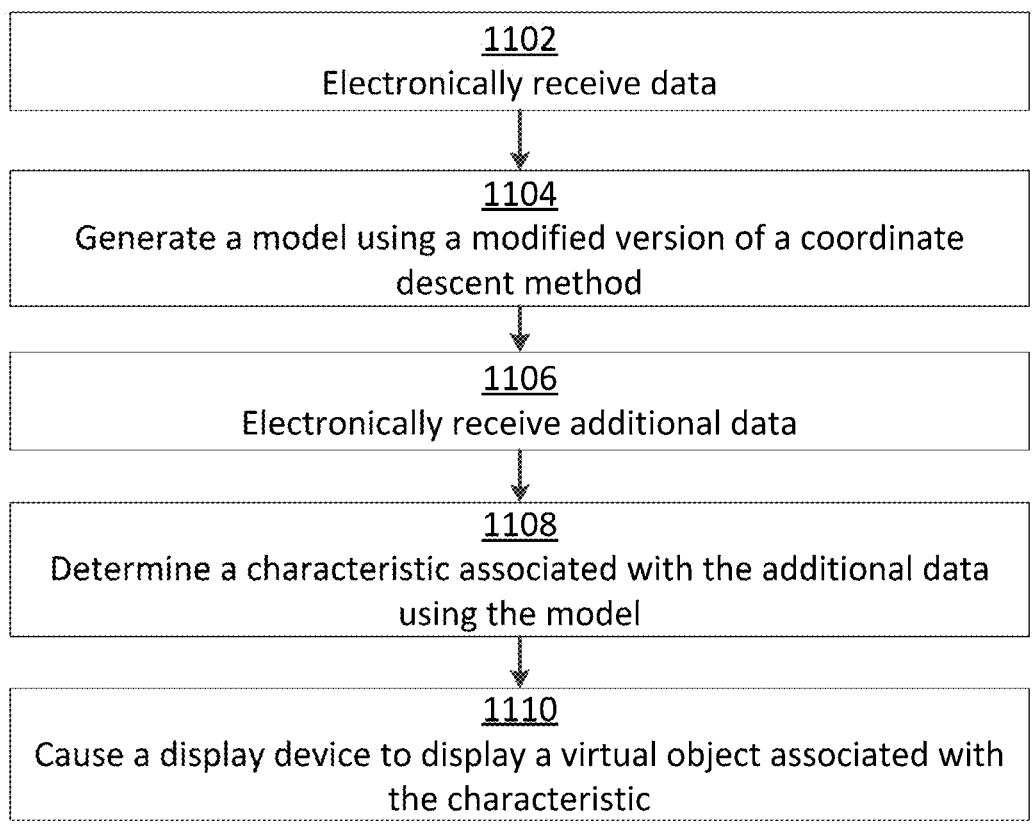
FIG. 11 is a flow chart of an example of a process for enhancing modeling speeds in an electronic device according to some aspects.

FIG. 11 is a flow chart of an example of a process for enhancing modeling in an electronic device according to some aspects. Some examples can include more, fewer, or different steps than the steps depicted in FIG. 11. Also, some examples can implement the steps of the process in a different order. Some examples can be implemented using any of the systems and processes described with respect to FIGS. 1-10.

In block 1102, a processor electronically receives data. The processor can electronically receive at least a portion of the data from a local source, such as a local memory device; a remote source, such as a remote computing device (e.g., via the Internet); or both of these. For example, the data can be stored in a remote database. The processor can access the remote database via the Internet and retrieve at least a portion of the data.

Figure 13:
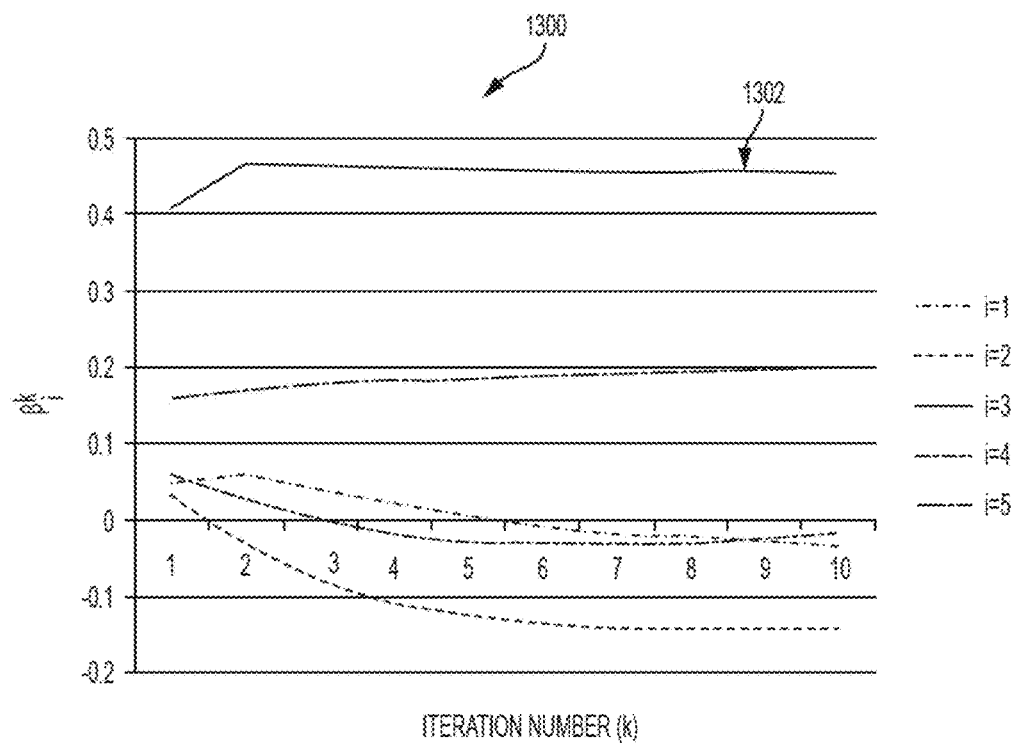
FIG. 13 is a graph of an example of regression coefficient values obtained using a traditional coordinate descent method according to some aspects.

In block 1104, the processor generates a model from the data using a modified version of a coordinate descent method. The modified version can be based on the ray-continuation property described above and illustrated in FIG. 13. FIG. 13 shows a graph 1300 in which the X axis indicates an iteration number (k) during a coordinate descent. The Y axis indicates a regression coefficient value ($\beta$) for the $i^{th}$ coordinate at the $k^{th}$ iteration. Line 1302 can show regression coefficient values for one coordinate (i=3), and other lines can show regression coefficients for other coordinates (e.g., i=1, 2, 4, or 5). The continuity of each line can exemplify the abovementioned ray-continuation property. As a particular example shown by line 1302, if the current iteration of the coordinate descent method is five (k=5), the regression coefficient obtained for the next iteration (k=6) lies on the line 1302 that passes through the regression coefficient value obtained in the current iteration (k=5) and the regression coefficient value obtained from the previous iteration (k=4). The modified version can take into account the ray-continuation property, making the modified version faster and computationally less expensive than traditional coordinate descent, resulting in less time, memory, processing, and electrical power usage.

More specifically, the modified version of the coordinate descent method can include determining a next regression coefficient for a next iteration ($\beta^{k+1}$) using a refined search point, designated as $s^k$, rather than the current regression coefficient ($\beta^k$). The refined search point can be determined according to the following equation:

$$s^k = (1-\alpha^k)h^k + \alpha^k \beta^k \qquad \text{(Equation 2)}$$

where k is the iteration number; $s^k$ is the refined search point at iteration k; $\beta^k$ is the current regression coefficient at iteration k; $h^k$ is a properly chosen historical solution (e.g., as described in greater detail below); and $\alpha^k$ is an optimal refinement factor that optimizes the following univariate optimization problem:

$$\alpha^k = \arg\min_\alpha \{g(\alpha) = f((1-\alpha)h^k + \alpha\beta^k)\} \qquad \text{(Equation 3)}$$

where $\alpha^k$ is a positive value.

Figure 14:
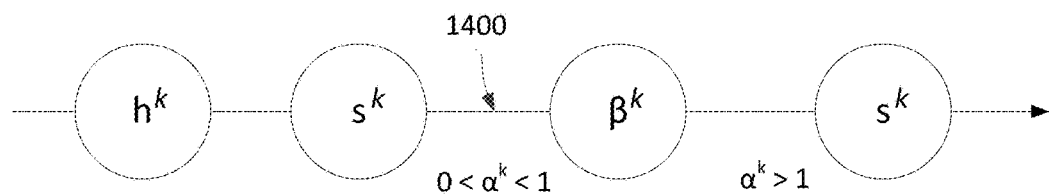
FIG. 14 is an example of a relationship between a refined search point, a historical solution, and a current regression coefficient according to some aspects.

FIG. 14 graphically illustrates the relationship between $s^k$, $\beta^k$, $h^k$, and $\alpha$. As shown in FIG. 14, the search point $s^k$ lies on the ray 1400 that starts from the historical solution $h^k$, passes through the current solution $\beta^k$, and also achieves the minimum objective function value among all the points on the ray, thereby optimizing Equation 3.

In some examples, the historical solution ($h^k$) can be equal to $s^{k-1}$ (the search point for the immediate previous iteration). That is:

$$h^k = s^{k-1} \qquad \text{(Equation 4)}$$

Figure 15:
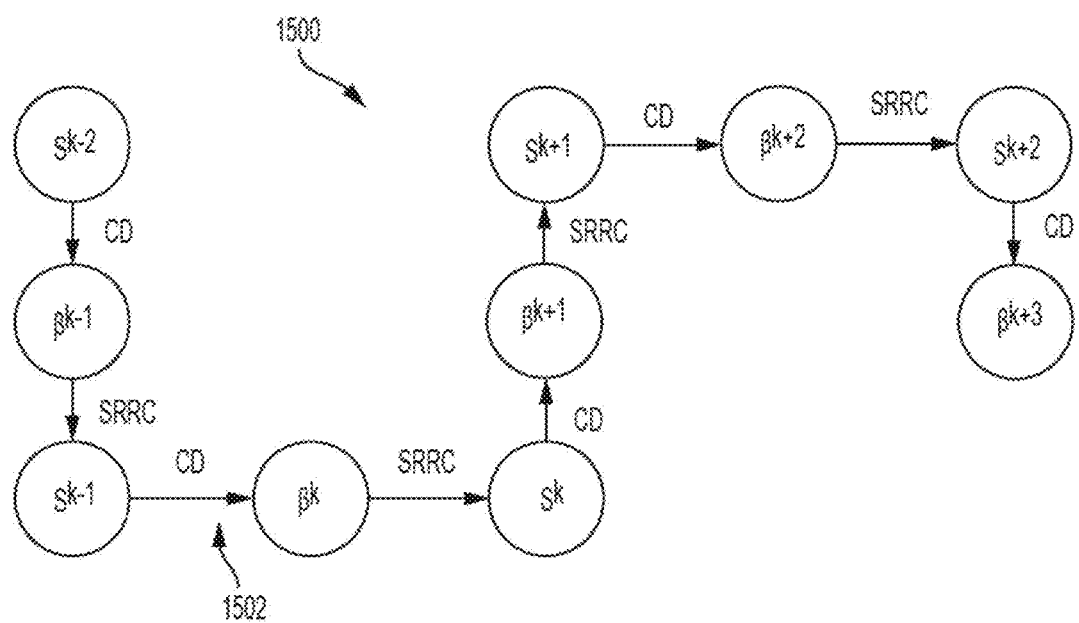
FIG. 15 is an example of a successive ray refinement chain (SRRC) technique for enhancing modeling speeds according to some aspects.

This scheme can be referred to as successive ray refinement chain (SRRC), since the generated values follow a chain structure, as shown in FIG. 15. In FIG. 15, $s^k$ can represent the refined search point, $\beta^{k+1}$ can represent the regression coefficient obtained by applying coordinate descent (CD) using the refined search point. As shown, $s^{k-1}$, $\beta^k$ and $s^k$ all lie along the same direction 1502. The coordinate descent can control the direction of the chain.

Performing a coordinate descent using the refined search point with the SRRC scheme can take fewer iterations than using traditional coordinate descent. For example, FIG. 16 is a table 1600 of an example of regression coefficient values obtained using SRRC. As shown in FIG. 16, SRRC can allow for the value of $f(\beta^k)$ to converge to a value below $10^{-3}$ (e.g., 0.00063) in 7 iterations, as compared to 10 iterations using traditional coordinate descent (e.g., as shown in FIG. 12). As another example, using SRRC can allow for the value of $f(\beta^k)$ to converge to a value below $10^{-4}$ in 14 iterations, as compared to 29 iterations using traditional coordinate descent. As another example, using SRRC can allow for the value of $f(\beta^k)$ to converge to a value below $10^{-8}$ in 16 iterations, as compared to 103 iterations using traditional coordinate descent.

In other examples, the historical solution ($h^k$) can be equal to $\beta^{k-1}$ (the regression coefficient for the immediate previous iteration). That is:

$$h^k = \beta^{k-1} \qquad \text{(Equation 5)}$$

Figure 17:
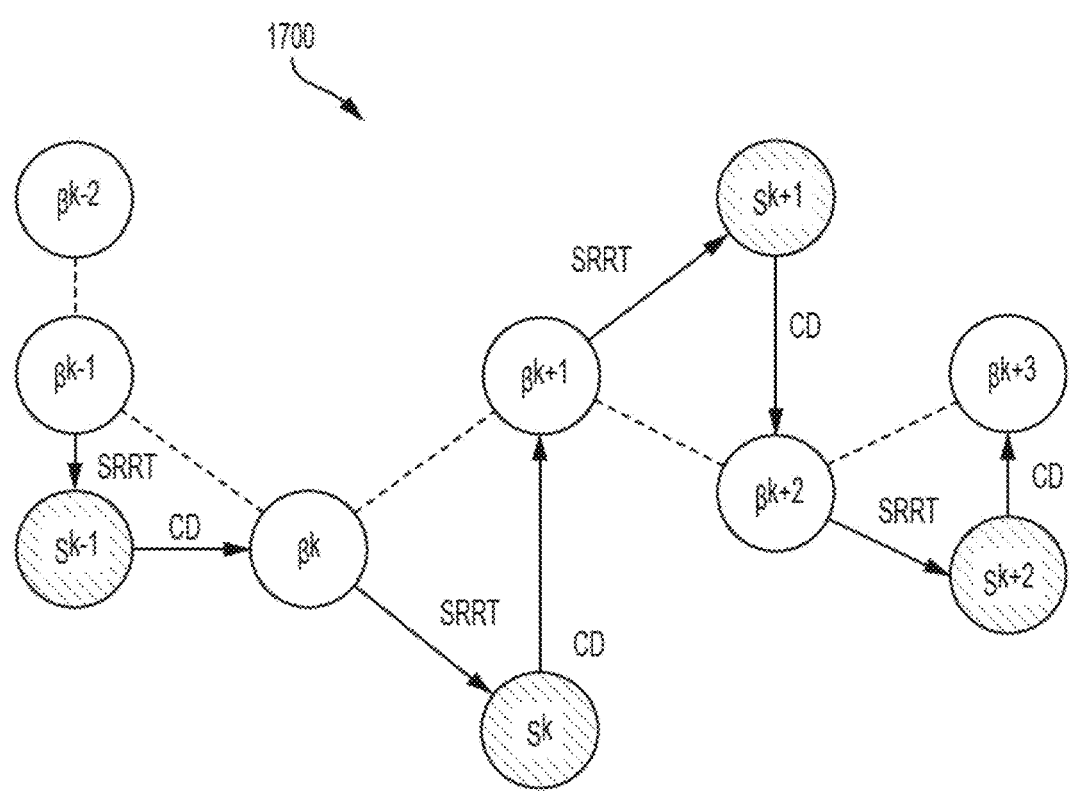
FIG. 17 is an example of a successive ray refinement triangle (SRRT) technique for enhancing modeling speeds according to some aspects.
Figure 18:
FIG. 18 is a table of an example of regression coefficient values obtained using the SRRT technique shown in FIG. 17 according to some aspects.

This scheme can be referred to as successive ray refinement triangle (SRRT), since the generated values follow a triangle structure, as shown in FIG. 17. Performing a coordinate descent using the refined search point with the SRRT scheme can take fewer iterations than using traditional coordinate descent. For example, FIG. 18 is a table 1800 of an example of regression coefficient values obtained using SRRT. As shown in FIG. 18, SRRT can greatly reduce the number of iterations used in performing a coordinate descent.

Figure 19:
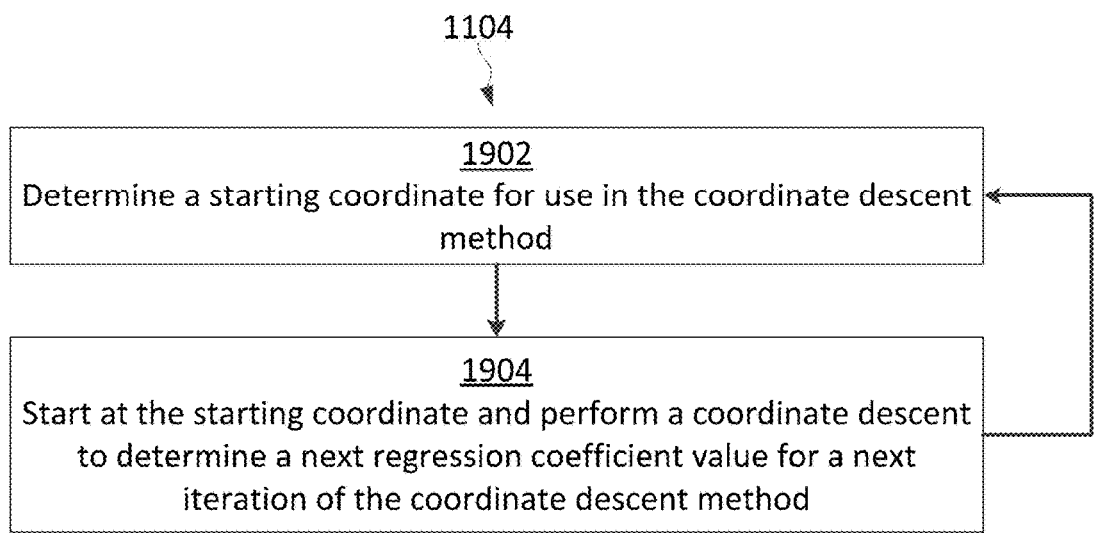
FIG. 19 is a flow chart of an example of a process for generating a model using a modified coordinate descent method according to some aspects.

In some examples, the processor can generate the model using the modified version of coordinate descent by performing one or more steps depicted in FIG. 19.

In block 1902, the processor determines a starting coordinate (e.g., the refined search point $s^k$) for use in a coordinate descent method. The coordinate descent method can be the modified version of coordinate descent discussed above. The processor can determine the starting coordinate based on Equation 2, which can represent a relationship between (i) a previous starting coordinate ($s^{k-1}$) or a previous regression coefficient value ($\beta^{k-1}$) from an immediately prior iteration of the coordinate descent method, which collectively can be referred to as $h^k$; (ii) a current regression coefficient value ($\beta^k$) associated with a current iteration (k) of the coordinate descent method; and (iii) a refinement factor ($\alpha^k$) configured to minimize a result of a univariate algorithm (e.g., Equation 3).

In block 1904, the processor starts at the starting coordinate and performs a coordinate descent to determine a next regression coefficient value ($\beta^{k+1}$) for a next iteration (k+1) of the coordinate descent method. Blocks 1902-1904 can be repeated for multiple iterations (e.g., until $f(\beta)$ in Equation 1 has converged to a suitably low value).

Returning to FIG. 11, in block 1106, the processor electronically receives additional data. The processor can electronically receive at least a portion of the additional data from a local source, such as a local memory device; a remote source, such as a remote computing device (e.g., via the Internet); or both of these. For example, the additional data can be stored in a remote database. The processor can access the remote database via the Internet and retrieve at least a portion of the additional data.

In block 1108, the processor can use the model to determine a characteristic associated with the additional data. For example, the original data (e.g., from block 1102) can include features from images, such as x-rays or medical resonance images, and medical conditions. The processor can generate a model (e.g., in block 1104) that describes a relationship between the features in the images and the medical conditions. The processor can then receive another image, which can be the additional data, having a feature. The processor can use the model to determine one or more medical conditions associated with the image based on the feature.

As another example, the original data can include car colors, car models, and driver's ages associated with numbers of speeding tickets. The processor can generate a model that describes a relationship between the car colors, car models, driver's ages, and speeding tickets. The processor can then receive additional data that includes a car color, car model, and a driver's age. The processor can use the model to predict a number of speeding tickets that the driver of the car may receive.

In block 1110, the processor can cause a display device to display (e.g., a touch-screen display, computer monitor, television, etc.) a virtual object associated with the characteristic. For example, the processor can transmit a signal to the display device that can cause the display device to display the virtual object. The virtual object can include text, a graph, an image, an icon, or any combination of these. As a particular example, referring back to the example discussed with respect to block 1108 in which or more medical conditions are determined based on an image using the model, the processor can cause the display device to display information related to the one or more medical conditions.

Additionally or alternatively, the processor can transmit information associated with the characteristic to a remote device via the Internet, store the information in a local memory, store the information in a database, or any combination of these.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

The invention claimed is:

1. A non-transitory computer readable medium comprising program code for reducing the number of processing iterations and memory accesses to generate one or more models usable to perform data analysis, the program code being executable by a processor for causing the processor to:
    determine a plurality of regression coefficient values associated with a regression analysis of data using a coordinate descent method for finding a minimum value of a least absolute shrinkage and selection operator (LASSO) cost function, wherein each iteration of the coordinate descent method comprises:
        determining a starting coordinate based on (i) a previous starting coordinate or a previous regression coefficient value from an immediately prior iteration of the coordinate descent method; (ii) a current regression coefficient value associated with a current iteration of the coordinate descent method; and (iii) a refinement factor configured to minimize a result of a univariate algorithm comprising a relationship between (a) the refinement factor, (b) the previous starting coordinate or the previous regression coefficient value, and (c) the current regression coefficient value for the current iteration; and
        starting at the starting coordinate and performing a coordinate descent to determine a next regression coefficient value for a next iteration of the coordinate descent method;
    generate a model that represents a relationship between a plurality of independent variables and the data by assigning a respective weight to each respective independent variable of the plurality of independent variables, each respective weight being a particular regression coefficient value of the plurality of regression coefficient values that corresponds to the respective independent variable;
    receive additional data; and
    determine a characteristic associated with additional data using the model.

2. The non-transitory computer readable medium of claim 1, wherein the starting coordinate is based on the previous starting coordinate from the immediately prior iteration of the coordinate descent method.

3. The non-transitory computer readable medium of claim 1, wherein the starting coordinate is based on the previous regression coefficient value from the immediately prior iteration of the coordinate descent method.

4. The non-transitory computer readable medium of claim 1, wherein the additional data comprises information about an image.

5. The non-transitory computer readable medium of claim 1, wherein the respective weight assigned to each respective independent variable comprises an amount that the respective independent variable influences the data.

6. The non-transitory computer readable medium of claim 1, further comprising program code executable by the processor for causing the processor to cause a display device to output a graph associated with the model.

7. The non-transitory computer readable medium of claim 1, wherein the coordinate descent method is configured to use a lower number of computational iterations for determining the plurality of regression coefficient values than another coordinate descent method in which a subsequent regression coefficient is determined based on an immediately prior regression coefficient and exclusive of the current regression coefficient value and the refinement factor.

8. The non-transitory computer readable medium of claim 1, wherein the coordinate descent method is configured to use less memory for storing coordinate descent data than another coordinate descent method in which a subsequent regression coefficient is determined based on an immediately prior regression coefficient and exclusive of the current regression coefficient value and the refinement factor.

9. The non-transitory computer readable medium of claim 1, further comprising program code executable by the processor for causing the processor to communicate the next regression coefficient value for the next iteration of the coordinate descent method to a worker node in a communications grid computing system for generating the model.

10. A system for reducing the number of processing iterations and memory access to generate one or more models usable to perform data analysis, the system comprising:
    a processing device; and
    a memory device in which instructions executable by the processing device are stored for causing the processing device to:
        determine a plurality of regression coefficient values associated with a regression analysis of data using a coordinate descent method for finding a minimum value of a least absolute shrinkage and selection operator (LASSO) cost function, wherein each iteration of the coordinate descent method comprises:
            determining a starting coordinate based on (i) a previous starting coordinate or a previous regression coefficient value from an immediately prior iteration of the coordinate descent method; (ii) a current regression coefficient value associated with a current iteration of the coordinate descent method; and (iii) a refinement factor configured to minimize a result of a univariate algorithm comprising a relationship between (a) the refinement factor, (b) the previous starting coordinate or the previous regression coefficient value, and (c) the current regression coefficient value for the current iteration; and starting at the starting coordinate and performing a coordinate descent to determine a next regression coefficient value for a next iteration of the coordinate descent method;

generate a model that represents a relationship between a plurality of independent variables and the data by assigning a respective weight to each respective independent variable of the plurality of independent variables, each respective weight being a particular regression coefficient value of the plurality of regression coefficient values that corresponds to the respective independent variable;

receive additional data; and determine a characteristic associated with additional data using the model.

11. The system of claim 10, wherein the starting coordinate is based on the previous starting coordinate from the immediately prior iteration of the coordinate descent method.

12. The system of claim 10, wherein the starting coordinate is based on the previous regression coefficient value from the immediately prior iteration of the coordinate descent method.

13. The system of claim 10, wherein the additional data comprises information about an image.

14. The system of claim 10, wherein the respective weight assigned to each respective independent variable comprises an amount that the respective independent variable influences the data.

15. The system of claim 10, wherein the memory device further comprises instructions executable by the processing device for causing the processing device to cause a display device to output a graph associated with the model.

16. The system of claim 10, wherein the coordinate descent method is configured to use a lower number of computational iterations for determining the plurality of regression coefficient values than another coordinate descent method in which a subsequent regression coefficient is determined based on an immediately prior regression coefficient and exclusive of the current regression coefficient value and the refinement factor.

17. The system of claim 10, wherein the coordinate descent method is configured to use less memory for storing coordinate descent data than another coordinate descent method in which a subsequent regression coefficient is determined based on an immediately prior regression coefficient and exclusive of the current regression coefficient value and the refinement factor.

18. The system of claim 10, wherein the memory device further comprises instructions executable by the processing device for causing the processing device to communicate the next regression coefficient value for the next iteration of the coordinate descent method to a worker node in a communications grid computing system for generating the model.

19. A computer-implemented method for reducing the number of processing iterations and memory accesses to generate one or more models usable to perform data analysis, the method comprising:

determining a plurality of regression coefficient values associated with a regression analysis of data by using a coordinate descent method for finding a minimum value of a least absolute shrinkage and selection operator (LASSO) cost function, wherein each iteration of the coordinate descent method comprises:

determining a starting coordinate based on (i) a previous starting coordinate or a previous regression coefficient value from an immediately prior iteration of the coordinate descent method; (ii) a current regression coefficient value associated with a current iteration of the coordinate descent method; and (iii) a refinement factor configured to minimize a result of a univariate algorithm comprising a relationship between (a) the refinement factor, (b) the previous starting coordinate or the previous regression coefficient value, and (c) the current regression coefficient value for the current iteration; and starting at the starting coordinate and performing a coordinate descent to determine a next regression coefficient value for a next iteration of the coordinate descent method;

generating a model that represents a relationship between a plurality of independent variables and the data by assigning a respective weight to each respective independent variable of the plurality of independent variables, each respective weight being a particular regression coefficient value of the plurality of regression coefficient values that corresponds to the respective independent variable;

receiving additional data; and determining a characteristic associated with additional data using the model.

20. The computer-implemented method of claim 19, wherein the starting coordinate is based on the previous starting coordinate from the immediately prior iteration of the coordinate descent method.

21. The computer-implemented method of claim 19, wherein the starting coordinate is based on the previous regression coefficient value from the immediately prior iteration of the coordinate descent method.

22. The computer-implemented method of claim 19, wherein the additional data comprises information about an image.

23. The computer-implemented method of claim 19, wherein the respective weight assigned to each respective independent variable comprises an amount that the respective independent variable influences the data.

24. The computer-implemented method of claim 19, further comprising causing a display device to output a graph associated with the model.

25. The computer-implemented method of claim 19, wherein the coordinate descent method is configured to use a lower number of computational iterations for determining the plurality of regression coefficient values than another coordinate descent method in which a subsequent regression coefficient is determined based on an immediately prior regression coefficient and exclusive of the current regression coefficient value and the refinement factor.

26. The computer-implemented method of claim 19, wherein the coordinate descent method is configured to use less memory for storing coordinate descent data than another coordinate descent method in which a subsequent regression coefficient is determined based on an immediately prior regression coefficient and exclusive of the current regression coefficient value and the refinement factor.

27. The computer-implemented method of claim 19, further comprising communicating the next regression coefficient value for the next iteration of the coordinate descent method to a worker node in a communications grid computing system for generating the model.

* * * * *